(12) United States Patent
Lee et al.

(10) Patent No.: US 11,456,442 B2
(45) Date of Patent: Sep. 27, 2022

(54) ORGANIC LIGHT EMITTING DISPLAY DEVICE INCLUDING A TRANSPARENT REGION

(71) Applicant: Samsung Display Co., LTD., Yongin-si (KR)

(72) Inventors: Hye-Sog Lee, Osan-si (KR); Jae-Joong Kwon, Suwon-si (KR); Yun-Seon Do, Hwaseong-si (KR); Young-Jun Seo, Seoul (KR)

(73) Assignee: Samsung Display Co., Ltd.

( * ) Notice: Subject to any disclaimer, the term of this patent is extended or adjusted under 35 U.S.C. 154(b) by 202 days.

(21) Appl. No.: 15/457,818

(22) Filed: Mar. 13, 2017

(65) Prior Publication Data

US 2017/0263895 A1 Sep. 14, 2017

(30) Foreign Application Priority Data

Mar. 14, 2016 (KR) .................. 10-2016-0030202

(51) Int. Cl.
*H01L 51/52* (2006.01)
*H01L 27/32* (2006.01)

(52) U.S. Cl.
CPC ...... *H01L 51/5271* (2013.01); *H01L 27/3211* (2013.01); *H01L 27/3246* (2013.01); *H01L 27/3258* (2013.01); *H01L 27/3262* (2013.01); *H01L 51/5225* (2013.01); *H01L 51/5253* (2013.01); *H01L 51/524* (2013.01); *H01L 51/5262* (2013.01)

(58) Field of Classification Search
CPC ............. H01L 51/5271; H01L 27/3246; H01L 27/3267; H01L 2251/5323; H01L 51/5262; H01L 51/5275; H01L 27/3211; H01L 27/3258; H01L 27/3262; H01L 51/5225
USPC .................................... 257/40, 59, E51.018
See application file for complete search history.

(56) References Cited

U.S. PATENT DOCUMENTS

| 2003/0030768 | A1* | 2/2003 | Sakamoto | ......... G02F 1/133555 349/113 |
| 2004/0227159 | A1* | 11/2004 | Nakashima | .......... G09G 3/3225 257/202 |
| 2011/0079797 | A1* | 4/2011 | Sumida | ............... H01L 51/5253 257/88 |

(Continued)

FOREIGN PATENT DOCUMENTS

| KR | 10-2013-0019973 A | 2/2013 |
| KR | 10-2013-0072875 A | 7/2013 |

(Continued)

*Primary Examiner* — David Chen
(74) *Attorney, Agent, or Firm* — Innovation Counsel LLP

(57) ABSTRACT

An organic light emitting display device includes a substrate, a lower electrode, a light emitting layer, an upper electrode, and a light guide structure. The substrate includes a sub-pixel region and a transparent region. The lower electrode is disposed in the sub-pixel region on the substrate. The light emitting layer is disposed on the lower electrode, and includes an organic emission layer. The upper electrode is disposed on the light emitting layer. The light guide structure is disposed on the upper electrode, and partially overlaps the organic emission layer that is located at the sub-pixel region and the substrate that is located at the transparent region in a plan view.

20 Claims, 17 Drawing Sheets

(56) References Cited

U.S. PATENT DOCUMENTS

| | | | | |
|---|---|---|---|---|
| 2013/0285022 A1* | 10/2013 | Su | ............... | H01L 51/5092 |
| | | | | 257/40 |
| 2014/0077725 A1* | 3/2014 | Lee | ............... | G09G 3/3225 |
| | | | | 315/312 |
| 2014/0145158 A1* | 5/2014 | Choi | ............... | H01L 51/5012 |
| | | | | 257/40 |
| 2015/0060832 A1* | 3/2015 | Ito | ............... | H01L 51/5225 |
| | | | | 257/40 |
| 2015/0194634 A1* | 7/2015 | Kang | ............... | H01L 51/5275 |
| | | | | 257/40 |
| 2015/0349293 A1* | 12/2015 | Park | ............... | H01L 51/5253 |
| | | | | 257/40 |
| 2015/0357392 A1* | 12/2015 | You | ............... | H01L 27/3223 |
| | | | | 257/40 |
| 2017/0053971 A1* | 2/2017 | Sato | ............... | H01L 51/5209 |

FOREIGN PATENT DOCUMENTS

| | | |
|---|---|---|
| KR | 10-2013-0094095 A | 8/2013 |
| KR | 10-2015-0019885 A | 2/2015 |
| KR | 10-2015-0031100 A | 3/2015 |

\* cited by examiner

ORGANIC LIGHT EMITTING DISPLAY DEVICE INCLUDING A TRANSPARENT REGION

CROSS-REFERENCE TO RELATED APPLICATION(S)

This application claims priority under 35 USC § 119 to Korean Patent Application No. 10-2016-0030202, filed on Mar. 14, 2016 in the Korean Intellectual Property Office (KIPO), the contents of which are incorporated herein in its entirety by reference.

BACKGROUND

1. Technical Field

Example embodiments relate generally to organic light emitting display devices. More particularly, embodiments of the present inventive concept relate to organic light emitting display devices including a transparent region.

2. Description of the Related Art

A flat panel display (FPD) device is widely used as a display device of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, thereby a light of a certain wavelength can be emitted.

Recently, a transparent OLED device capable of transmitting an image of an object (or a target) that is located at the back (e.g., in the rear) of the OLED device by including a sub-pixel region and a transparent region has been developed. Here, since a displaying image of the OLED device is displayed only in a first direction (e.g., in the front), a user that is located in the back of the OLED device may not watch the displaying image.

SUMMARY

Some example embodiments provide an organic light emitting display device capable of displaying a displaying image on both sides.

According to an aspect of example embodiments, an organic light emitting display (OLED) device includes a substrate, a lower electrode, a light emitting layer, an upper electrode, and a light guide structure. The substrate includes a sub-pixel region and a transparent region. The lower electrode is disposed in the sub-pixel region on the substrate. The light emitting layer is disposed on the lower electrode, and includes an organic emission layer. The upper electrode is disposed on the light emitting layer. The light guide structure is disposed on the upper electrode, and partially overlaps the organic emission layer that is located at the sub-pixel region and the substrate that is located at the transparent region in a plan view.

In example embodiments, the organic emission layer may include a first region exposed by the light guide structure and a second region overlapping the light guide structure. A first light emitted from the first region of the organic emission layer may be emitted in a first direction that is from the lower electrode into the upper electrode. A second light emitted from the second region of the organic emission layer may travel from the sub-pixel region to the transparent region through the light guide structure, and the second light in the transparent region may be emitted in a second direction that is opposite to the first direction.

In example embodiments, the light guide structure may include an incidence surface on which the second light emitted from the second region of the organic emission layer is incident and an emission surface on which the second light is emitted. The second light emitted from the second region of the organic emission layer may be incident inside the light guide structure through the incidence surface. The second light may have a predetermined light path inside the light guide structure, such that the second light may travel in a direction from the sub-pixel region to the transparent region. The second light may be emitted outside the light guide structure through the emission surface.

In example embodiments, the OLED device may further include a reflection pattern disposed on the light guide structure.

In example embodiments, the reflection pattern may be disposed on an upper surface of the light guide structure that is located in the sub-pixel region, and may expose an upper surface of the light guide structure that is located in the transparent region.

In example embodiments, the OLED device may further include a pixel defining layer disposed on the substrate. The pixel defining layer may cover both lateral portions of the lower electrode and may expose a portion of the lower electrode. The upper electrode may be interposed between the light guide structure and the organic emission layer and between the light guide structure and the pixel defining layer that is located adjacent to the transparent region, and may expose the transparent region.

In example embodiments, the light guide structure may include an incidence surface on which the second light emitted from the second region of the organic emission layer is incident and an emission surface on which the second light is emitted. The second light emitted from the second region of the organic emission layer may be incident inside the light guide structure through the incidence surface. The second light may have a predetermined light path between the upper electrode and the reflection pattern, such that the second light may travel in a direction from the sub-pixel region to the transparent region. The second light may be emitted outside the light guide structure through the emission surface.

In example embodiments, the reflection pattern may be disposed on an upper surface of the light guide structure that is located in the sub-pixel region and an upper surface of the light guide structure that is located in the transparent region.

In example embodiments, the OLED device may further include a pixel defining layer disposed on the substrate. The pixel defining layer may cover both lateral portions of the lower electrode and may expose a portion of the lower electrode. The upper electrode may be interposed between the light guide structure and the organic emission layer and between the light guide structure and the pixel defining layer that is located adjacent to the transparent region, and may expose the transparent region. The upper electrode may extend along a side wall of the pixel defining layer that is located adjacent to the transparent region.

In example embodiments, the second light emitted from the second region of the organic emission layer may be reflected between the reflection pattern disposed on an upper surface of the light guide structure and the upper electrode disposed under a lower surface of the light guide structure in a direction from the sub-pixel region to the transparent region such that the second light is emitted outside the light guide structure.

In example embodiments, the OLED device may further include an encapsulation substrate disposed on the upper electrode and a filler filling a space between the light guide structure and the encapsulation substrate. A refractive index of the light guide structure may be greater than a refractive index of the filler.

In example embodiments, the OLED device may further include an encapsulation substrate disposed between the upper electrode and the light guide structure. A lower surface of the encapsulation substrate may face the upper electrode, and the light guide structure may be disposed on an upper surface of the encapsulation substrate.

In example embodiments, the OLED device may further include a reflection pattern disposed on the light guide structure.

In example embodiments, the OLED device may further include a semiconductor element disposed between the substrate and the lower electrode. The semiconductor element may include an active layer, a gate insulation layer, a gate electrode, an insulating interlayer, and source and drain electrodes. The active layer may be disposed in the sub-pixel region on the substrate. The gate insulation layer may be disposed on the substrate to cover the active layer in the sub-pixel region. The gate electrode may be disposed on the active layer. The insulating interlayer may be disposed on the gate insulation layer to cover the gate electrode in the sub-pixel region. The source and drain electrodes may be on the gate electrode.

In example embodiments, the light guide structure in the sub-pixel region may contact the upper electrode, and the light guide structure in the transparent region may contact the insulating interlayer.

In example embodiments, the gate insulation layer and the insulating interlayer may expose the transparent region.

In example embodiments, the light guide structure in the sub-pixel region may contact the upper electrode, and the light guide structure in the transparent region may contact the substrate.

In example embodiments, the OLED device may further include a planarization layer disposed on the insulating interlayer and a pixel defining layer disposed in the sub-pixel region on the planarization layer. The planarization layer may cover the source and drain electrodes in the sub-pixel region and may expose the transparent region. The pixel defining layer may cover both lateral portions of the lower electrode and may expose a portion of the lower electrode.

In example embodiments, the light guide structure may cover a portion of the organic emission layer, the pixel defining layer that is located adjacent to the transparent region, and the planarization layer, and may be disposed in a portion of the transparent region.

In example embodiments, the upper electrode may be interposed between the light guide structure and the organic emission layer and between the light guide structure and the pixel defining layer that is located adjacent to the transparent region, and may expose the transparent region.

As an OLED device according to example embodiments includes the light guide structure. As the light guide structure is disposed in a portion of the organic emission layer and a portion of the insulating interlayer that is located in the transparent region, the OLED device may emit a portion of a light, which is emitted in the first direction from the organic emission layer, through the light guide structure in the second direction. Accordingly, the OLED device may serve as a double-sided OLED device without an additional EL. In addition, as the OLED device includes the transparent region, an image of an object that is located at the back of the OLED device may be displayed in the first direction D1 or an image of an object that is located in the front of the OLED device may be displayed in the second direction. Accordingly, the OLED device may serve as a transparent OLED device.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
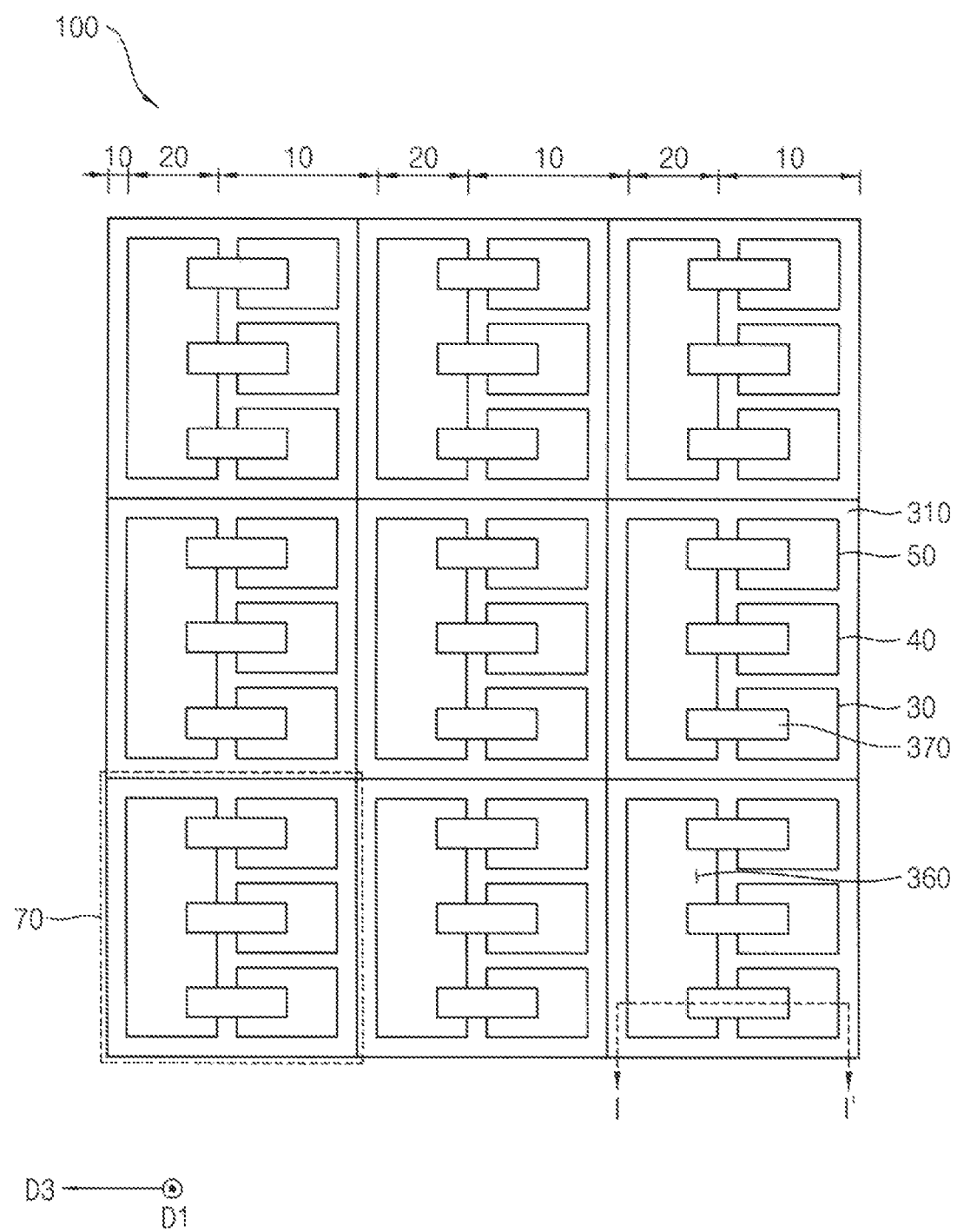
FIG. 1 is a plan view illustrating an organic light emitting display (OLED) device in accordance with example embodiments.

FIG. 1 is a plan view illustrating an organic light emitting display (OLED) device in accordance with example embodiments.

Referring to FIG. 1, an organic light emitting display (OLED) device 100 may include a plurality of pixel regions 70. The pixel regions 70 may be entirely arrange in an upper surface of a substrate, which will be described below, included in the OLED device 100.

One pixel region 70 among a plurality of the pixel regions 70 may have a sub-pixel region 10 and a transparent region 20.

First, second, and third sub-pixel regions 30, 40, and 50 may be located in the sub-pixel region 10, and a transparent window 360 may be located in the transparent region 20.

In example embodiments, a shape of the first, second, and third sub-pixel regions 30, 40, and 50 and a shape of the transparent window 360 have a planar shape of a substantially tetragonal shape, but not being limited thereto. For example, a shape of the first, second, and third sub-pixel regions and a shape of the transparent window 360 may have a planar shape of a substantially triangle shape, a substantially diamond shape, a substantially polygonal shape, a substantially circular shape, a substantially track shape, or a substantially elliptical shape.

First, second, and third sub-pixels may be disposed in the first, second, and third sub-pixel regions 30, 40, and 50, respectively. For example, the first sub-pixel may emit a red color of a light, and the second sub-pixel may emit a green color of a light. In addition, the third sub-pixel may emit a blue color of a light.

A light incident from the outside may be transmitted in the transparent region 20 through the transparent window 360. The first, second, and third sub-pixel regions 30, 40, and 50 may share one transparent region 20. Alternatively, each of the first, second, and third sub-pixel regions 30, 40, and 50 may have a transparent region 20, respectively.

The first, second, and third sub-pixel regions 30, 40, and 50 and the transparent region 20 may be surrounded by a pixel defining layer 310. That is, the first, second, and third sub-pixel regions 30, 40, and 50 may be defined by the pixel defining layer 310, and the pixel defining layer 310 may expose the first, second, and third sub-pixel regions 30, 40, and 50 and the transparent region 20. Metal wirings (e.g., data signal wirings, scan signal wirings, light emission signal wiring, power supply voltage wirings, etc) may be disposed under the pixel defining layer 310. Here, the metal wirings may be electrically connected to the first, second, and third sub-pixels. For example, the scan wirings may provide a scan signal to a semiconductor element included in each of the first, second, and third sub-pixels, and the data wirings may provide a data signal to a semiconductor element included in each of the first, second, and third sub-pixels. In addition, the power supply voltage wirings may provide a power supply voltage to a semiconductor element included in each of the first, second, and third sub-pixels. Alternatively, the pixel defining layer 310 may expose the first, second, and third sub-pixel regions 30, 40, and 50, and may be disposed in the transparent region 20.

In example embodiments, a light guide structure 370 may be disposed in a portion of the sub-pixel region 10 and a portion of the transparent region 20 on the substrate. The light guide structure 370 may overlap a portion of an organic emission layer, which will be described below, included in a light emitting layer of the OLED device 100, and the organic emission layer may emit light in a first direction D1 (e.g., the front of the OLED device 100). A light emitted from the organic emission layer in a portion where the organic emission layer and the light guide structure 370 are overlapped may be emitted in a second direction D2 (e.g., the back of the OLED device 100) through the light guide structure 370. Here, the second direction D2 may be opposite to the first direction D1.

As the OLED device 100 according to example embodiments includes the light guide structure 370, the OLED device 100 may display a displaying image in the first and second directions D1 and D2. Accordingly, the OLED device 100 may serve as a double-sided OLED device. In addition, as the OLED device 100 includes the transparent window 360, an image of an object that is located at the back of the OLED device 100 may be displayed in the first direction D1 or an image of an object that is located in the front of the OLED device 100 may be displayed in the second direction D2. Accordingly, the OLED device 100 may serve as a transparent OLED device.

In example embodiments, one pixel region 10 of the OLED device 100 includes the first through third sub-pixel regions 30, 40, and 50 and one transparent region 20, but not being limited thereto. In some example embodiments, for example, one pixel region 70 may include a plurality of sub-pixel regions and one transparent region 20. In addition, in example embodiments, a plurality of pixel regions 70 may be regularly arranged, but not being limited thereto. For example, the pixel regions 70 may be irregularly arranged.

Figure 2:
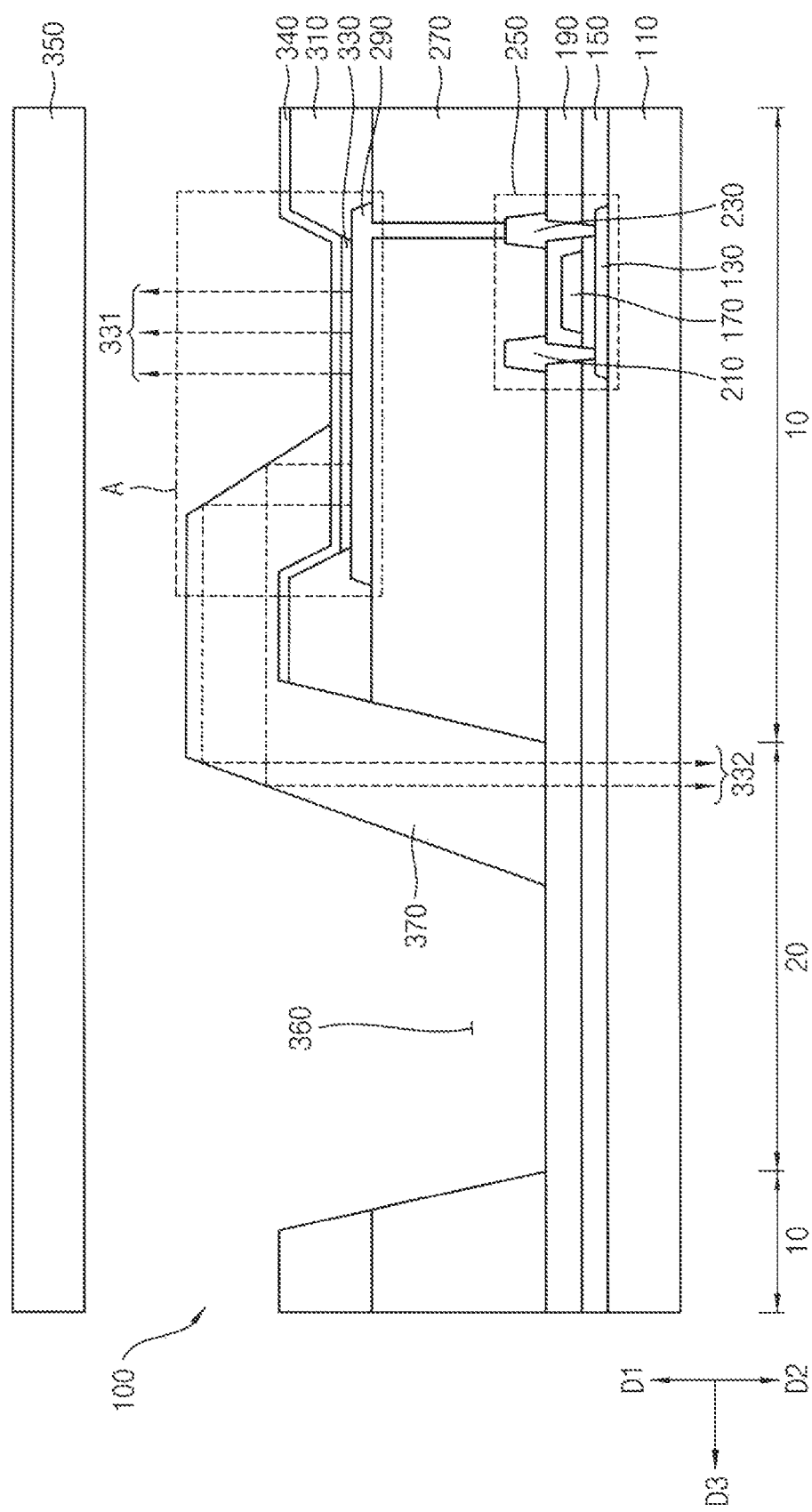
FIG. 2 is a cross-sectional view taken along a line I-I' of FIG. 1.
Figure 3:
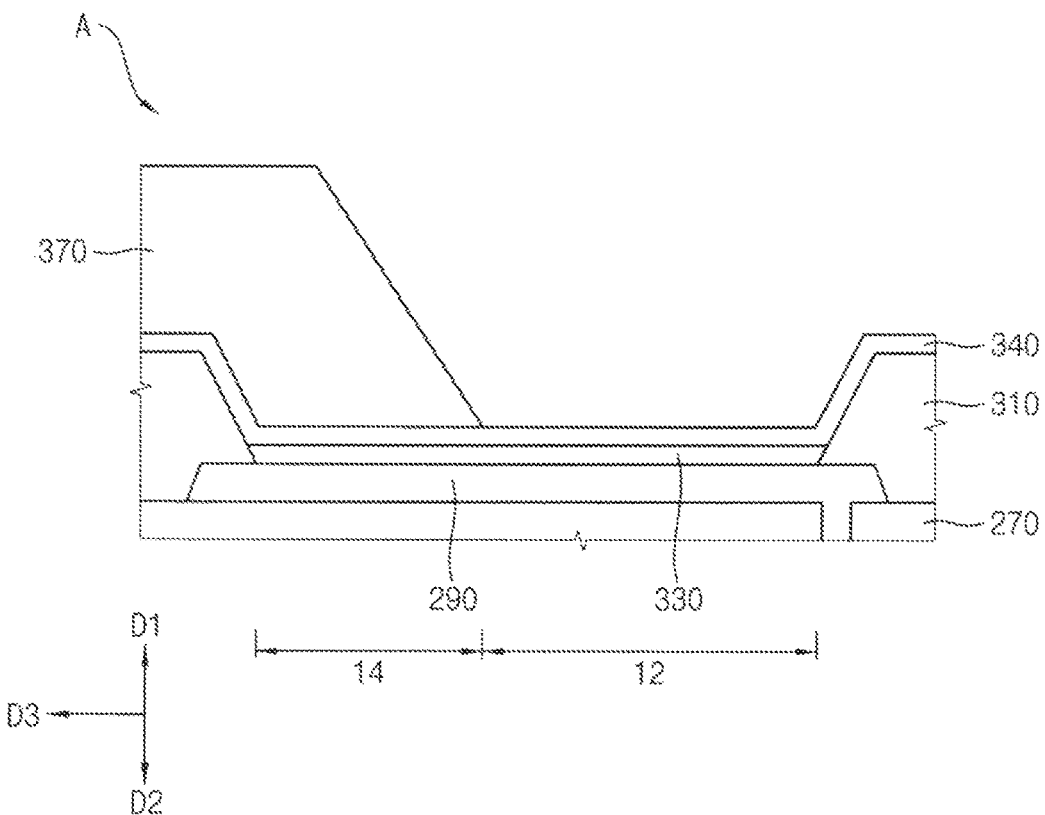
FIG. 3 is an enlarged plan view corresponding to region 'A' of FIG. 2.
Figure 4:
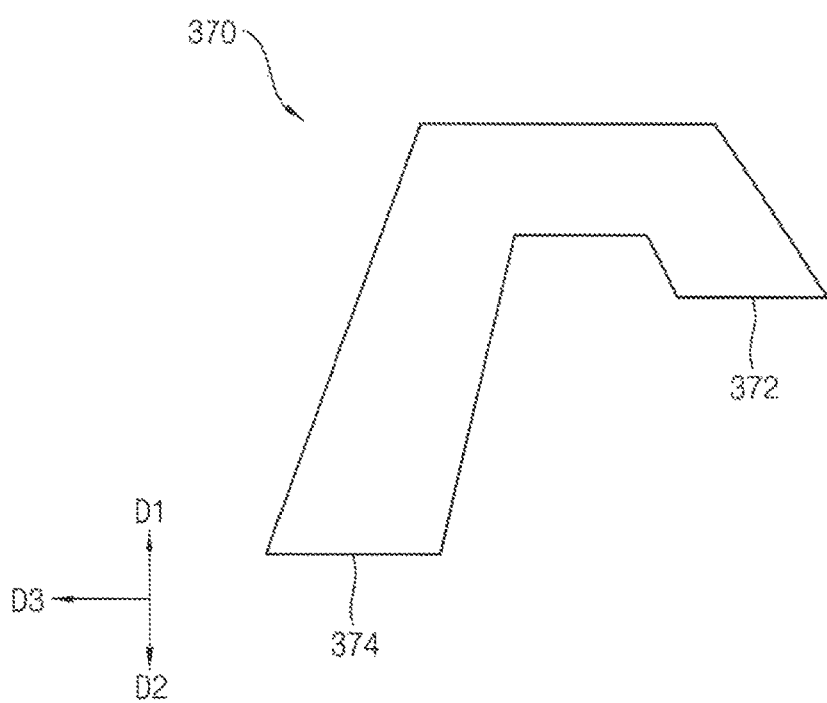
FIG. 4 is a cross-sectional view for describing a light guide structure of FIG. 2.
Figure 5:
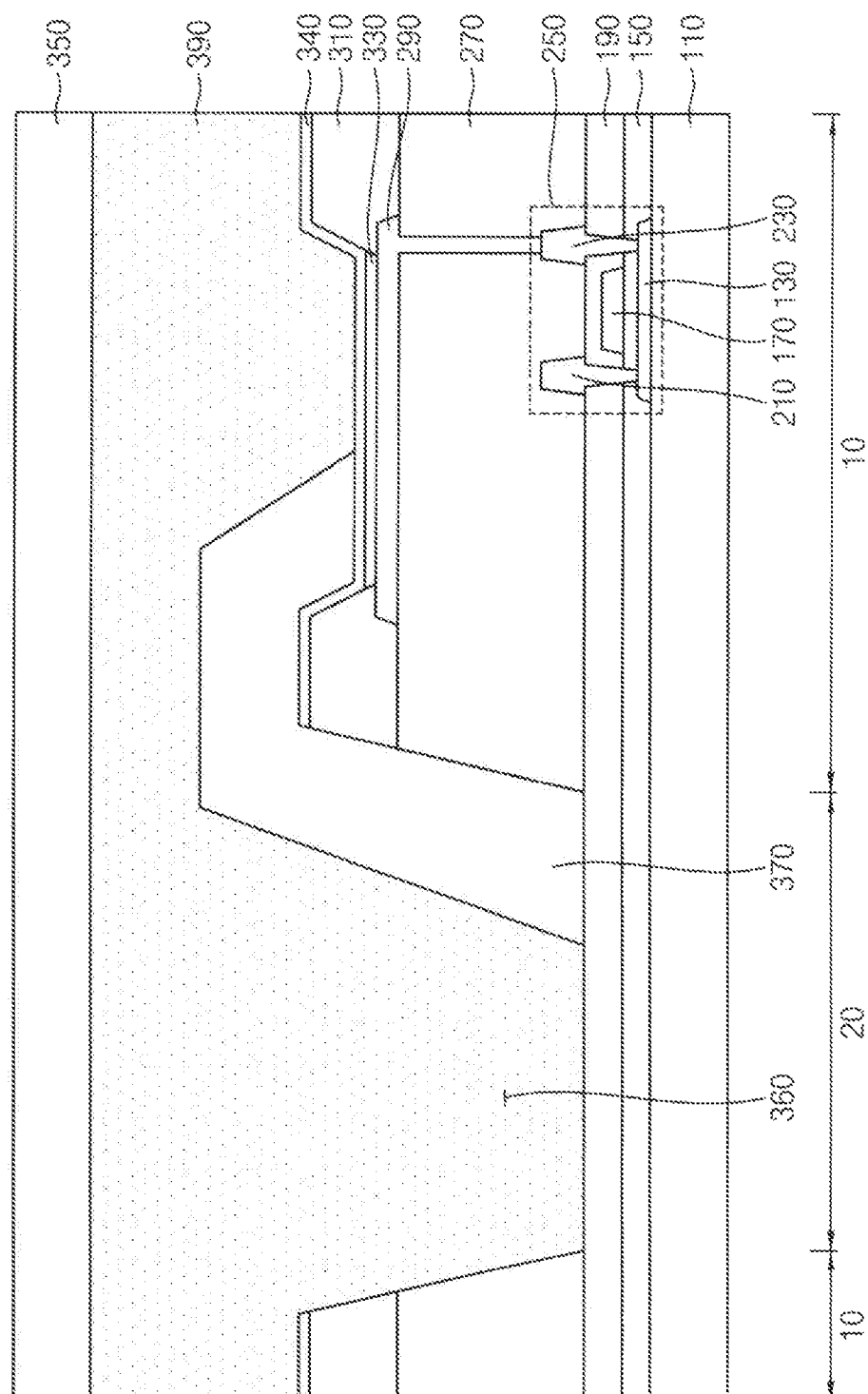
FIG. 5 is a cross-sectional view for describing a filler of FIG. 2.

FIG. 2 is a cross-sectional view taken along a line I-I' of FIG. 1, and FIG. 3 is an enlarged plan view corresponding to region 'A' of FIG. 2. FIG. 4 is a cross-sectional view for describing a light guide structure of FIG. 2, and FIG. 5 is a cross-sectional view for describing a filler of FIG. 2.

Referring to FIG. 2, an OLED device 100 may include a substrate 110, a semiconductor element 250, a planarization layer 270, a sub-pixel structure, a pixel defining layer 310, a light guide structure 370, an encapsulation substrate 350, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. Further, the light emitting layer 330 may include an organic emission layer (EL), a hole injection layer (HIL), a hole transfer layer (HTL), an electron transfer layer (ETL), an electron injection layer (EIL), etc.

As illustrated in FIG. 1, the OLED device 100 may include a plurality of pixel regions. One pixel region among a plurality of the pixel regions may have a sub-pixel region 10 and a transparent region 20.

In the sub-pixel region 10, a displaying image may be displayed in a first direction D1 that is vertical to an upper surface of the substrate 110. In the transparent region 20, an image of an object that is located in a second direction D2, which is opposite to the first direction D1, of the OLED device 100 may be displayed in the first direction D1. The OLED device 100 may serve as a transparent OLED device.

The substrate 110 may be formed of transparent materials. For example, the substrate 110 may include a quartz substrate, a synthetic quartz substrate, a calcium fluoride substrate, a fluoride-doped quartz substrate, a sodalime glass substrate, a non-alkali glass substrate etc. Alternatively, the substrate 110 may be formed of a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the semiconductor element 250 and the sub-pixel structure (e.g., the lower electrode 290, the light emitting layer 330, the upper electrode 340, etc). That is, the substrate 110 may have a structure in which the first polyimide layer, the barrier film layer and the second polyimide layer are stacked on the rigid glass substrate. In a manufacturing the OLED device 100, after an insulating layer (e.g., a buffer layer) is provided on the second polyimide layer of the polyimide substrate, the semiconductor element 250 and the sub-pixel structure may be disposed on the insulating layer. After the semiconductor element 250 and the sub-pixel structure are formed on the insulating layer, the rigid glass substrate on which the polyimide substrate is disposed may be removed. It may be difficult to directly form the semiconductor element 250 and the sub-pixel structure on the polyimide substrate because the polyimide substrate is relatively thin and flexible. Accordingly, the semiconductor element 250 and the sub-pixel structure are formed on the polyimide substrate and the rigid glass substrate, and then the polyimide substrate may serve as the substrate 110 of the OLED device 100 after the removal of the rigid glass substrate. As the OLED device 100 includes the sub-pixel region 10 and the transparent region 20, the substrate 110 may also include the sub-pixel region 10 and the transparent region 20.

A buffer layer (not shown) may be disposed on the substrate 110. The buffer layer may be disposed on the entire substrate 110. The buffer layer may prevent the diffusion of metal atoms and/or impurities from the substrate 110 into the semiconductor element 250. Additionally, the buffer layer may control a rate of a heat transfer during a crystallization process for forming the active layer 130, thereby may help to obtain a substantially uniform active layer. Furthermore, the buffer layer may improve a surface flatness of the substrate 110 when a surface of the substrate 110 is relatively uneven. According to a type of the substrate 110, at least two buffer layers may be provided on the substrate 110, or the buffer layer may not be disposed. For example, the buffer layer may include organic materials or inorganic materials.

The active layer 130 may be disposed in the sub-pixel region 10 on the substrate 110, and may include an oxide semiconductor, an inorganic semiconductor (e.g., amorphous silicon, polysilicon, etc.), an organic semiconductor, etc.

The gate insulation layer 150 may be disposed on the active layer 130. The gate insulation layer 150 may cover the active layer 130 in the sub-pixel region 10 on the substrate 110, and may be disposed on the entire substrate 110. For example, the gate insulation layer 150 may sufficiently cover the active layer 130, and may have a substantially even surface without a step around the active layer 130. Alternatively, the gate insulation layer 150 may cover the active layer 130, and may be disposed as a substantially uniform thickness along a profile of the active layer 130. The gate insulation layer 150 may include a silicon compound, a metal oxide, etc. For example, the gate insulation layer 150 may include silicon oxide (SiOx), silicon nitride (SiNx), silicon oxynitride (SiOxNy), silicon oxycarbide (SioxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), etc.

The gate electrode 170 may be disposed on the gate insulation layer 150. The gate electrode 170 may be located on a portion of the gate insulation layer 150 under which the active layer 130 is disposed to overlap the active layer 130 in a plan view. The gate electrode 170 may include a metal, a metal alloy, metal nitride, conductive metal oxide, transparent conductive materials, etc. For example, the gate electrode 170 may include gold (Au), silver (Ag), aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), etc. These may be used alone or in a suitable combination thereof. Alternatively, the gate electrode 170 may have a multi-layered structure.

The insulating interlayer 190 may be disposed on the gate electrode 170. The insulating interlayer 190 may cover the gate electrode 170 in the sub-pixel region 10, and may be disposed on the entire gate insulation layer 150. For example, the insulating interlayer 190 may sufficiently cover the gate electrode 170, and may have a substantially even surface without a step around the gate electrode 170. Alternatively, the insulating interlayer 190 may cover the gate electrode 170, and may be disposed as a substantially uniform thickness along a profile of the gate electrode 170. The insulating interlayer 190 may include a silicon compound, a metal oxide, etc.

The source electrode 210 and the drain electrode 230 may be disposed in the sub-pixel region 10 on the insulating interlayer 190. The source electrode 210 may be in contact with a first side of the active layer 130 via a contact hole formed by removing a portion of the gate insulation layer 150 and the insulating interlayer 190. The drain electrode 230 may be in contact with a second side of the active layer 130 via a contact hole formed by removing a portion of the gate insulation layer 150 and the insulating interlayer 190. Each of the source electrode 210 and the drain electrode 230 may include a metal, a metal alloy, metal nitride, conductive metal oxide, transparent conductive materials, etc. These may be used alone or in a suitable combination thereof. Alternatively, each of the source electrode 210 and the drain electrode 230 may have a multi-layered structure. Accordingly, the semiconductor element 250 including the active layer 130, the gate insulation layer 150, the gate electrode 170, the insulating interlayer 190, the source electrode 210, and the drain electrode 230 may be disposed.

In example embodiments, the semiconductor element 250 of the OLED device 100 has a top gate structure, but not being limited thereto. For example, in some example embodiments, the semiconductor element 250 may have a bottom gate structure.

The planarization layer 270 may be disposed on the source and drain electrodes 210 and 230 (or the semiconductor element 250), and the insulating interlayer 190. The planarization layer 270 may have an opening where the insulating interlayer 190 is exposed in the transparent region 20. The opening may be defined as a transparent window 360. For example, the planarization layer 270 may be disposed as a relatively high thickness to sufficiently cover the insulating interlayer 190 and the source and drain electrodes 210 and 230. In this case, the planarization layer 270 may have a substantially even upper surface, and a planarization process may be further performed on the planarization layer 270 to implement the even upper surface of the planarization layer 270.

The lower electrode 290 may be disposed in the sub-pixel region 10 on the planarization layer 270. For example, a thickness of the lower electrode 290 may be greater than that of the upper electrode 340 such that a light emitted from the EL is reflected in the first direction D1. The lower electrode 290 may be in contact with the drain electrode 230 of the semiconductor element 250 through a contact hole formed in the planarization layer 270. Thus, the lower electrode 290 may be electrically connected to the semiconductor element 250. The lower electrode 290 may include a metal, a metal alloy, metal nitride, conductive metal oxide, transparent conductive materials, etc. Theses may be used alone or in a suitable combination thereof. Alternatively, the lower electrode 290 may have a multi-layered structure.

The pixel defining layer 310 may be disposed on the planarization layer 270 in the sub-pixel region to expose the insulating interlayer 190 that is located in the transparent region 20. The patterning of the pixel defining layer 310 and the planarization layer 270 may be performed at the same time using a mask. The pixel defining layer 310 may cover both lateral portions of the lower electrode 290, and may expose a portion of the lower electrode 290. The EL may be located on the lower electrode 290 where a portion is exposed by the pixel defining layer 310. The pixel defining layer 310 may include organic materials or inorganic materials.

The light emitting layer 330 (or the EL) may be disposed on a portion where the lower electrode 290 is exposed. The light emitting layer 330 may have a multilayer structure including the EL (e.g., an organic emission layer), the HIL, the HTL, the ETL, the EIL), etc. The EL of the light emitting layer 330 may be formed using at least one of light emitting materials capable of generating different colors of light (e.g., a red color of light, a blue color of light, and a green color of light, etc) according to first, second, and third sub-pixels illustrated in FIG. 1. Alternatively, the EL of the light emitting layer 330 may generally generate a white color of light by stacking a plurality of light emitting materials capable of generating different colors of light such as a red color of light, a green color of light, a blue color of light, etc. In this case, a color filter may be disposed on the EL, and the color filter may not be disposed in the transparent region 20. The color filter may include at least one of a red color filter, a green color filter, and a blue color filter. Alternatively, the color filter may include a yellow color filter, a cyan color filter, and a magenta color filter. The color filter may include a photosensitive resin or a color photoresist, etc. In some example embodiments, the HIL, the HTL, the ETL, the EIL, etc except the EL may be disposed in the transparent region 20. In this case, the light emitting layer 330 illustrated in FIG. 2 may be corresponding to the EL.

The upper electrode 340 may be disposed in the sub-pixel region 10 on the pixel defining layer 310 and the EL, and may expose the insulating interlayer 190 that is located in the transparent region 20. The upper electrode 340 may include a metal, a metal alloy, metal nitride, conductive metal oxide, transparent conductive materials, etc. Accordingly, the sub-pixel structure including the lower electrode 290, the light emitting layer 330, and the upper electrode 340 may be disposed.

The light guide structure 370 may be disposed in a portion of the sub-pixel region 10 and a portion of the transparent region 20 on the substrate 110. In example embodiments, the light guide structure 370 may overlap a portion of the EL and a portion of the insulating interlayer 190 that is located in the transparent region 20. That is, the light guide structure 370 may be disposed on a portion of the EL, and may extend along a profile of the planarization layer 270, the pixel defining layer 310, and the upper electrode 340 in a third direction D3 (e.g., a direction from the sub-pixel region 10 into the transparent region 20) that is vertical to the first and second directions D1 and D2. In other word, the light guide structure 370 may cover a sidewall, which is located adjacent to the EL of lateral sidewalls, of the transparent window 360.

For example, as illustrated in FIG. 3, the EL may include a first region 12 and a second region 14. The first region 12 may be exposed by the light guide structure 370, and the second region 14 may overlap the light guide structure 370. Here, a light emitted from the first region 12 of the EL may be defined as a first light 331, and a light emitted from the second region 14 of the EL may be defined as a second light 332.

The first light 331 emitted from the first region 12 of the EL may be emitted in the first direction D1 (e.g., a direction from the lower electrode 290 into the upper electrode 340). The first light 331 may display a displaying image on a top surface of the OLED device 100.

In the transparent region 20, the second light 332 emitted from the second region 14 of the EL may be emitted in the second direction D2 that is opposite to the first direction D1. The second light 332 may display a displaying image on a bottom surface of the OLED device 100.

In particular, as illustrated in FIG. 4, the light guide structure 370 may include an incidence surface 372 on which the second light 332 emitted from the second region 14 of the EL is incident and an emission surface 374 on which the second light 332 is emitted. Here, the incidence surface 372 of the light guide structure 370 may be defined as a contact surface where the upper electrode 340 that is located on the EL is in contact with the light guide structure 370, and the emission surface 374 of the light guide structure 370 may be defined as a contact surface where the insulating interlayer 190 that is located in the transparent region 20 is in contact with the light guide structure 370.

The second light 332 emitted from the second region 14 of the EL may be incident inside the light guide structure 370 through the incidence surface 372. In addition, the second light 332 may have a predetermined light path inside the light guide structure 370, such that the second light 332 may travel in the third direction D3. Here, the second light 332 may be totally reflected inside the light guide structure 370 in the third direction D3, and the second light 332 may be transmitted inside the light guide structure 370. The second light 332 that is transmitted inside the light guide structure 370 in the third direction D3 may be emitted into the outside through the emission surface 374.

In example embodiments, the light path of the second light 332 includes a light path illustrated in FIG. 2, but not being limited thereto. For example, in some example embodiments, a light path of the second light 332 may have various light paths according to an angle where the second light 332 is emitted from the second region 14 of the EL.

In example embodiments, a refractive index of the light guide structure 370 may be relatively high such that the second light 332 is totally reflected inside the light guide structure 370 and travels in the third direction D3. For example, as illustrated in FIG. 5, the OLED device 100 may further include a filler 390 filling a space between the light guide structure 370 and the encapsulation substrate 350. A refractive index of the light guide structure 370 may be greater than that of the filler 390. The filler 390 may be substantially transparent, and may include a material where a transmissivity of a light emitted from the EL is not reduced. Air in a space between the light guide structure 370 and the encapsulation substrate 350 may serve as the filler 390. In addition, by forming transparent organic materials or transparent inorganic materials in the space, the materials may serve as the filler 390. The light guide structure 370 may include organic materials having a high refractive index, inorganic materials having a high refractive index, or a high molecular compound, etc. For example, the light guide structure 370 may include organic materials such as a photoresist, a polyacryl-based resin, a polyimide-based resin, a polyamide-based resin, a siloxane-based resin, an acryl-based resin, an epoxy-based resin, etc. In addition, the light guide structure 370 may include inorganic material such as SiOx, SiNx, SiOxNy, SiOxCy, SiCxNy, AlOx, AlNx, TaOx, HfOx, ZrOx, TiOx, etc. Further, the light guide structure 370 may include the high molecular compound such as polyethylene terephthalate (PET), polyethylene naphthalate (PEN), polypropylene (PP), polycarbonate (PC), polystyrene (PS), polysulfone (PSul), polyethyene (PE), polyphthalamide (PPA), polyethersulfone (PES), polyarylate (PAR), polycarbonate oxide (PCO), modified polyphenylene oxide (MPPO), etc.

The encapsulation substrate 350 may be disposed on the upper electrode 340 and the light guide structure 370. The encapsulation substrate 350 and the substrate 110 may include substantially the same materials. For example, the encapsulation substrate 350 may include quartz substrate, synthetic quartz substrate, calcium fluoride substrate, fluoride-doped quartz substrate, sodalime glass substrate, non-alkali glass substrate, etc. In some example embodiments, the encapsulation substrate 350 may include a transparent inorganic material or flexible plastic. For example, the encapsulation substrate 350 may include a flexible transparent resin substrate. In this case, to increase flexibility of the OLED device 100, the encapsulation substrate 350 may include a stacked structure where at least one inorganic layer and at least one organic layer are alternately stacked.

The OLED device 100 in accordance with example embodiments includes the light guide structure 370. As the light guide structure 370 is disposed in a portion of the EL and a portion of the insulating interlayer 190 that is located in the transparent region 20, the OLED device 100 may emit a portion of a light, which is emitted in the first direction D1 from the EL, through the light guide structure 370 in the second direction D2. Accordingly, the OLED device 100 may serve as a double-sided OLED device without an additional EL. In addition, as the OLED device 100 includes the transparent window 360, an image of an object that is located at the back of the OLED device 100 may be seen in the first direction D1 or an image of an object that is located in the front of the OLED device 100 may be seen in the second direction D2. Accordingly, the OLED device 100 may serve as a transparent OLED device.

FIGS. 6, 7, 8, 9 and 10 are cross-sectional views illustrating a method of manufacturing an OLED device in accordance with example embodiments.

Figure 6:
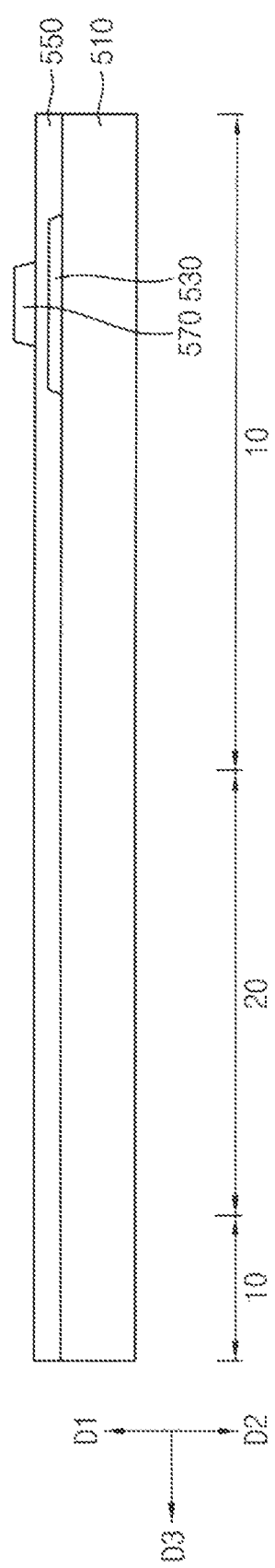
FIGS. 6, 7, 8, 9 and 10 are cross-sectional views illustrating a method of manufacturing an OLED device in accordance with example embodiments.

Referring to FIG. 6, a substrate 510 may be provided. The substrate 510 may be formed using a quartz substrate, a synthetic quartz substrate, a calcium fluoride substrate, a fluoride-doped quartz substrate, a sodalime glass substrate, a non-alkali glass substrate etc. A buffer layer (not shown) may be formed on the substrate 510. The buffer layer may be formed on the entire substrate 510, and the buffer layer may prevent the diffusion of metal atoms and/or impurities from the substrate 510.

An active layer 530 may be formed in a sub-pixel region 10 on the substrate 510. The active layer 530 may be formed using an oxide semiconductor, an inorganic semiconductor, an organic semiconductor, etc. A gate insulation layer 550 may be formed on the substrate 510. The gate insulation layer 550 may cover the active layer 530 in the sub-pixel region 10, and may be formed on the entire substrate 510. For example, the gate insulation layer 550 may sufficiently cover the active layer 530, and may have a substantially even surface without a step around the active layer 530. Alternatively, the gate insulation layer 550 may cover the active layer 530, and may be formed as a substantially uniform thickness along a profile of the active layer 530. The gate insulation layer 550 may include a silicon compound, a metal oxide, etc. For example, the gate insulation layer 550 may be formed using SiOx, SiNx, SiOxNy, SiOxCy, SiCxNy, AlOx, AlNx, TaOx, HfOx, ZrOx, TiOx, etc.

A gate electrode 570 may be formed on a portion of the gate insulation layer 550 under which the active layer 530 is located to overlap the active layer 530 in a plan view. The gate electrode 570 may include a metal, a metal alloy, metal nitride, conductive metal oxide, transparent conductive materials, etc. For example, the gate electrode 570 may be formed using Au, Ag, Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, etc. These may be used alone or in a suitable combination thereof. Alternatively, the gate electrode 570 may be formed as a multi-layered structure.

Figure 7:
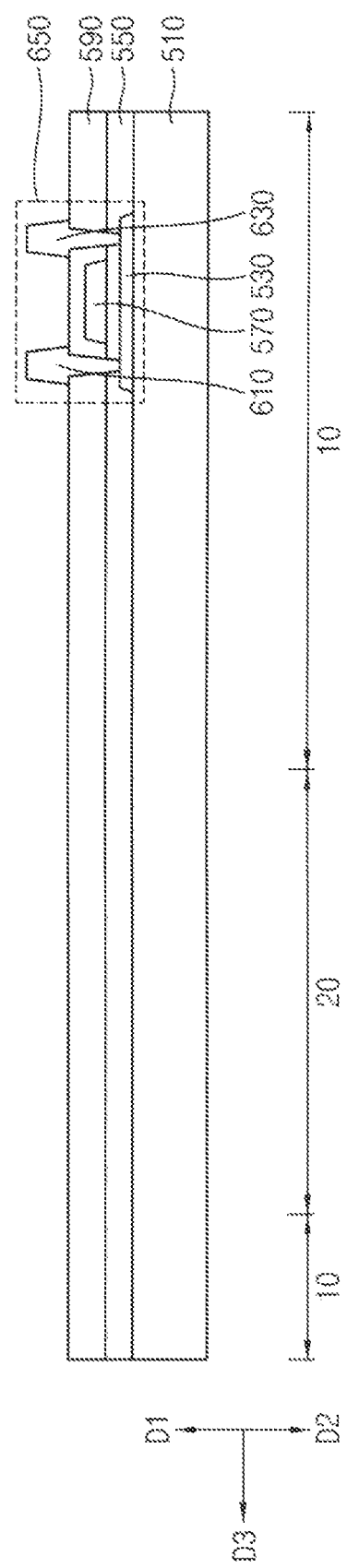

Referring to FIG. 7, an insulating interlayer 590 may be formed on the gate electrode 570. The insulating interlayer 590 may cover the gate electrode 570 in the sub-pixel region 10, and may be formed on the entire gate insulation layer 550. For example, the insulating interlayer 590 may sufficiently cover the gate electrode 570, and may have a substantially even surface without a step around the gate electrode 570. Alternatively, the insulating interlayer 590 may cover the gate electrode 570, and may be formed as a substantially uniform thickness along a profile of the gate electrode 570. The insulating interlayer 590 may be formed using a silicon compound, a metal oxide, etc.

A source electrode 610 and the drain electrode 630 may be formed in the sub-pixel region 10 on the insulating interlayer 590. The source electrode 610 may be in contact with a first side of the active layer 530 via a contact hole formed by removing a portion of the gate insulation layer 550 and the insulating interlayer 590. The drain electrode 630 may be in contact with a second side of the active layer 530 via a contact hole formed by removing a portion of the gate insulation layer 550 and the insulating interlayer 590. Each of the source electrode 610 and the drain electrode 630 may be formed of a metal, a metal alloy, metal nitride, conductive metal oxide, transparent conductive materials, etc. These may be used alone or in a suitable combination thereof. Alternatively, each of the source electrode 610 and the drain electrode 630 may be formed as a multi-layered structure. Accordingly, a semiconductor element 650 including the active layer 530, the gate insulation layer 550, the gate electrode 570, the insulating interlayer 590, the source electrode 610, and the drain electrode 630 may be formed.

Figure 8:
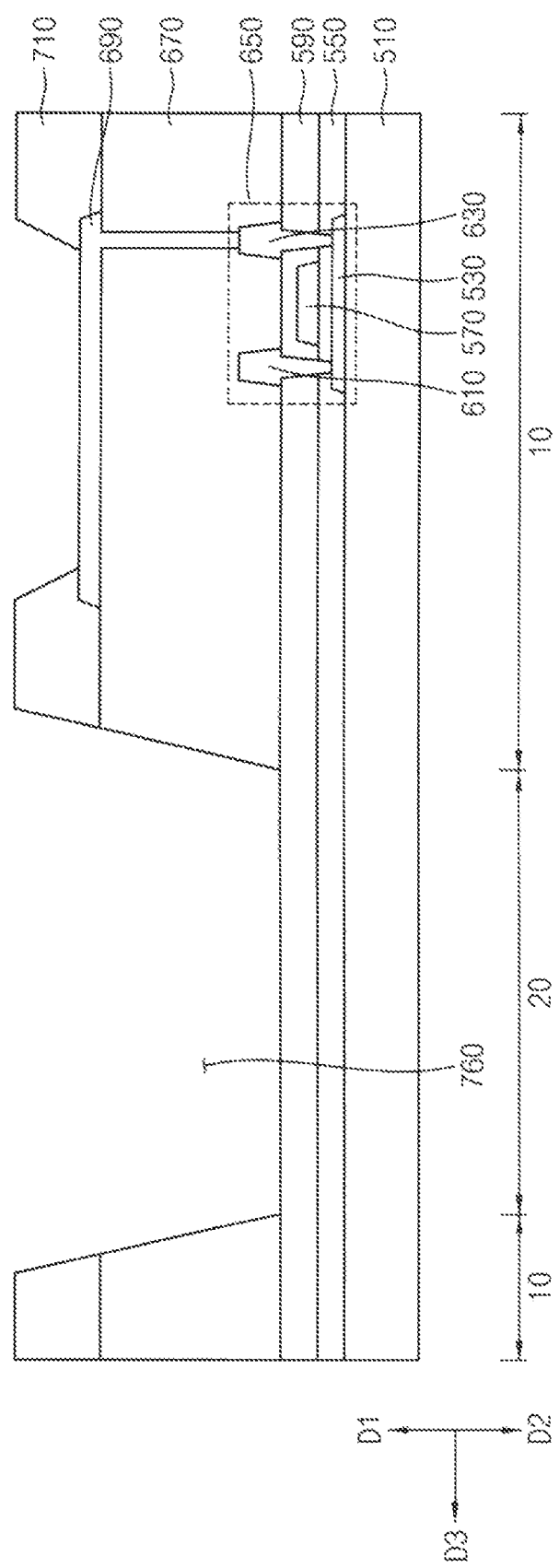

Referring to FIG. 8, a planarization layer 670 may be formed on the source and drain electrodes 610 and 630, and the insulating interlayer 590. The planarization layer 670 may have an opening where the insulating interlayer 590 is exposed in a transparent region 20. The opening may be defined as a transparent window 760. For example, a preliminary planarization layer may be formed as a relatively high thickness to sufficiently cover the insulating interlayer 590 and the source and drain electrodes 610 and 630. In this case, the preliminary planarization layer may have a substantially even upper surface, and a planarization process may be further performed on the preliminary planarization layer to implement the even upper surface of the preliminary planarization layer.

A lower electrode 690 may be formed in the sub-pixel region 10 on the planarization layer 670. The lower electrode 690 may be in contact with the drain electrode 630 through a contact hole formed in the planarization layer 670. Thus, the lower electrode 690 may be electrically connected to the semiconductor element 650. The lower electrode 690 may be formed using a metal, a metal alloy, metal nitride, conductive metal oxide, transparent conductive materials, etc. Theses may be used alone or in a suitable combination thereof. Alternatively, the lower electrode 690 may be formed as a multi-layered structure. When forming the contact hole, the planarization layer 670 in the transparent window 760 may be removed at the same time. However, the removal of the planarization layer 670 in the transparent window 760 may be performed during a formation process of the pixel defining layer 710 which will be described later.

A pixel defining layer 710 may be formed on the planarization layer 670 such that the insulating interlayer 590 that is located in the transparent region 20 is exposed. The pixel defining layer 710 may cover both lateral portions of the lower electrode 690, and may expose a portion of the lower electrode 690. A light emitting layer may be located on the lower electrode 690 where a portion is exposed by the pixel defining layer 710. The pixel defining layer 710 may be formed using organic materials or inorganic materials. The forming the pixel defining layer 710 and the planarization layer 670 may be formed at the same time using one mask in this step.

Figure 9:
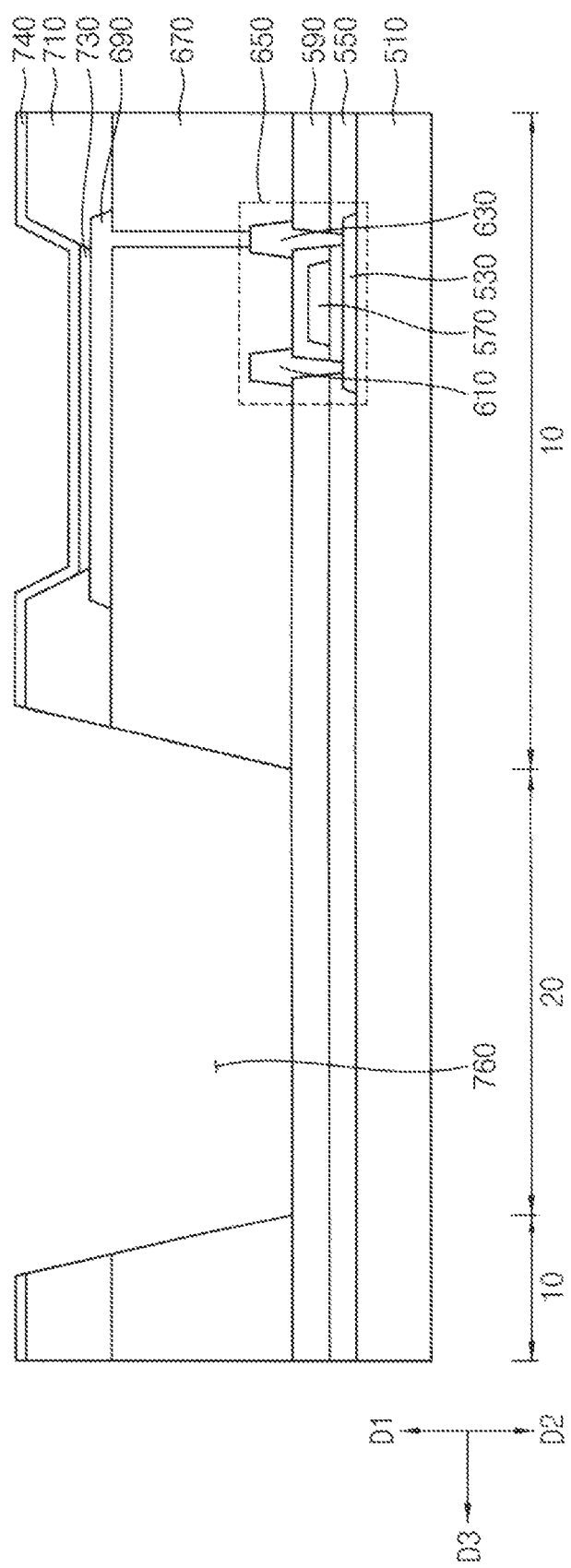

Referring to FIG. 9, a light emitting layer 730 may be formed on a portion where the lower electrode 690 is exposed. The light emitting layer 730 may have a multilayer structure including the EL (e.g., an organic emission layer), the HIL, the HTL, the ETL, the EIL), etc. The EL of the light emitting layer 730 may be formed using at least one of light emitting materials capable of generating different colors of light (e.g., a red color of light, a blue color of light, and a green color of light, etc) according to first, second, and third sub-pixels illustrated in FIG. 1. Alternatively, the EL of the light emitting layer 730 may generally generate a white color of light by stacking a plurality of light emitting materials capable of generating different colors of light such as a red color of light, a green color of light, a blue color of light, etc. In this case, a color filter may be formed on the EL, and the color filter may not be formed in the transparent region 20. The color filter may include at least one of a red color filter, a green color filter, and a blue color filter. Alternatively, the color filter may include a yellow color filter, a cyan color filter, and a magenta color filter. The color filter may be formed using a photosensitive resin or a color photoresist, etc. In some example embodiments, the HIL, the HTL, the ETL, the EIL, etc except the EL may be formed in the transparent region 20. In this case, the light emitting layer 330 illustrated in FIG. 2 may be corresponding to the EL.

An upper electrode 740 may be formed in the sub-pixel region 10 on the pixel defining layer 710 and the light emitting layer 730, and may expose the insulating interlayer 590 that is located in the transparent region 20 on the substrate 510. For example, after the transparent window 760 is formed, an organic layer such as lithium quinolone (LiQ) may be formed in both lateral sidewalls of the transparent window 760. When the organic layer is formed in a lateral sidewall of the transparent window 760, in a process for forming the upper electrode 740, the upper electrode 740 may be formed selectively in the sub-pixel region 10 on the substrate 510 and may not be formed in a region where the organic layer is formed. That is, a region where the upper electrode 740 is formed may be controlled by using the organic layer. The upper electrode 740 may cover the pixel defining layer 710 and the light emitting layer 730 in the sub-pixel region 10 except the transparent region 20. As the upper electrode 740 is not formed in the transparent region 20, a transmissivity of the transparent region 20 of an OLED device display device may be increased. The upper electrode 740 may be formed using a metal, a metal alloy, metal nitride, conductive metal oxide, transparent conductive materials, etc. These may be used alone or in a suitable combination thereof. The LiQ may have a low adhesive strength to a metal, and may be transparent. Accordingly, a sub-pixel structure including the lower electrode 690, the light emitting layer 730, and the upper electrode 740 may be formed.

Figure 10:
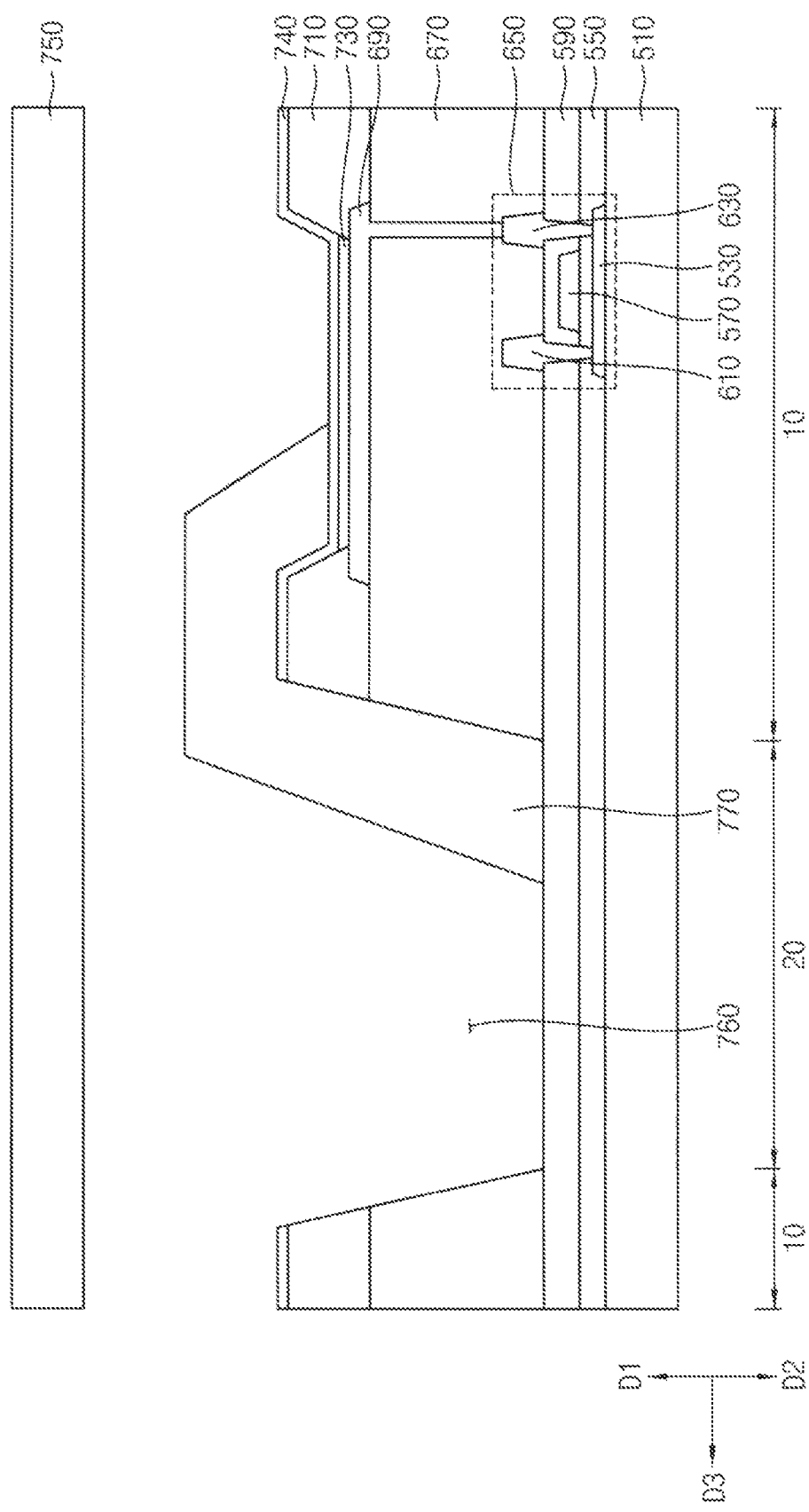

Referring to FIG. 10, a light guide structure 770 may be formed in a portion of the sub-pixel region 10 and a portion of the transparent region 20 on the substrate 510. In example embodiments, the light guide structure 770 may overlap a portion of the EL and a portion of the insulating interlayer 590 that is located in the transparent region 20. That is, the light guide structure 770 may be formed on a portion of the EL, and may extend along a profile of the planarization layer 670, the pixel defining layer 710, and the upper electrode 740 in a third direction D3 that is vertical to first and second directions D1 and D2. In other word, the light guide structure 770 may cover a sidewall, which is located adjacent to the EL of lateral sidewalls of the transparent window 760.

For example, after a preliminary light guide structure is formed on the entire substrate 510, the light guide structure 770 may be formed by partially removing the preliminary light guide structure. Here, the preliminary light guide structure may be partially removed using a photo mask process. In this case, to prevent a damage of the EL, an organic layer including fluorine may be interposed between the preliminary light guide structure and the upper electrode 740 where the EL is located. The organic layer including fluorine may protect the EL in the photo mask process.

An encapsulation substrate 750 may be formed on the upper electrode 740 and the light guide structure 770. The encapsulation substrate 750 and the substrate 510 may include substantially the same materials. For example, the encapsulation substrate 750 may be formed using quartz substrate, synthetic quartz substrate, calcium fluoride substrate, fluoride-doped quartz substrate, sodalime glass substrate, non-alkali glass substrate, etc. In some example embodiments, the encapsulation substrate 750 may include a transparent inorganic material or flexible plastic. For example, the encapsulation substrate 750 may be formed using a flexible transparent resin substrate. In this case, to increase flexibility of the OLED device, the encapsulation substrate 750 may include a stacked structure where at least one inorganic layer and at least one organic layer are alternately stacked. Accordingly, the OLED device 100 illustrated in FIG. 2 may be manufactured.

Figure 11:
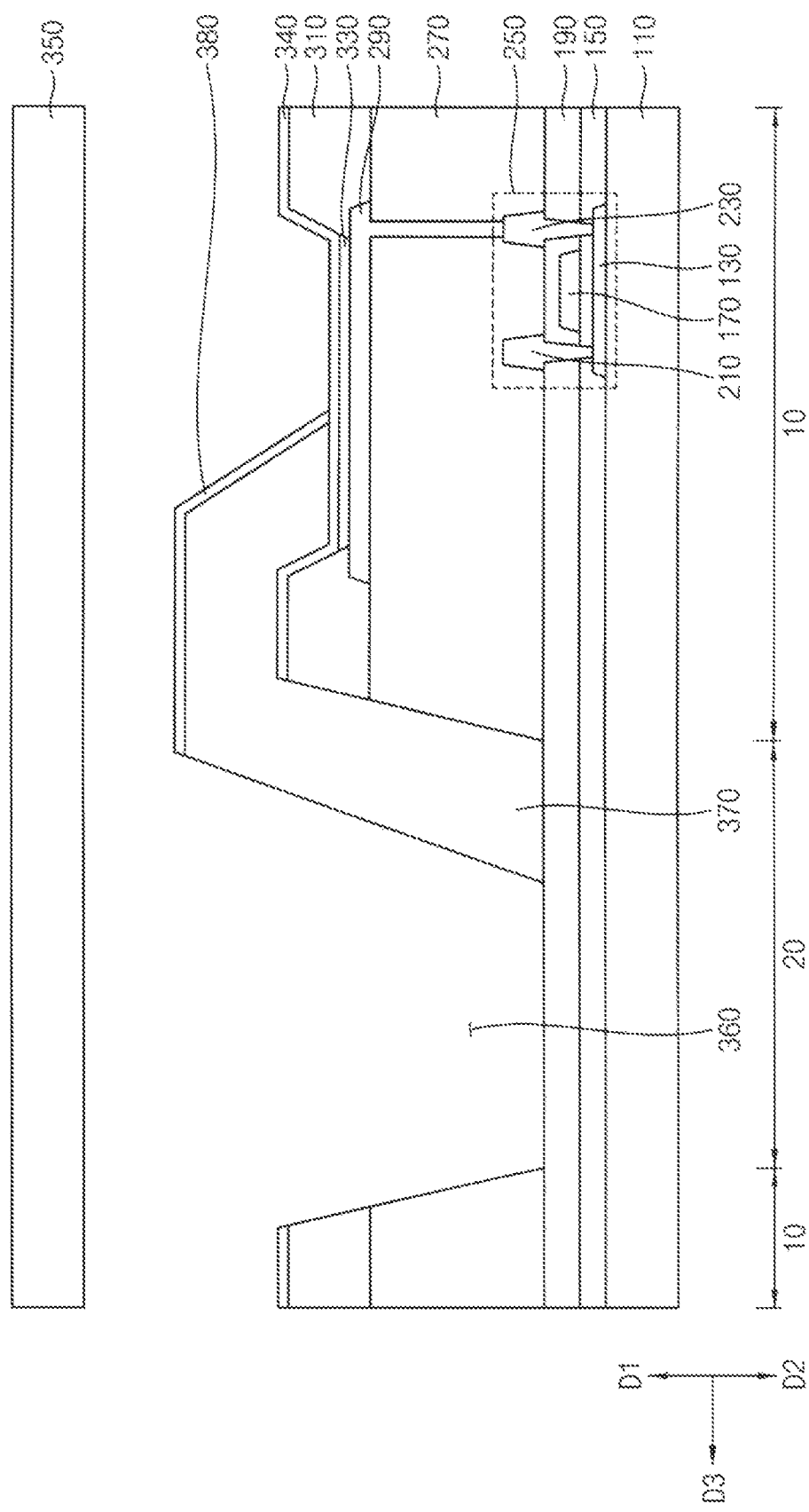
FIG. 11 is a cross-sectional view illustrating an OLED device in accordance with example embodiments.
Figure 12:
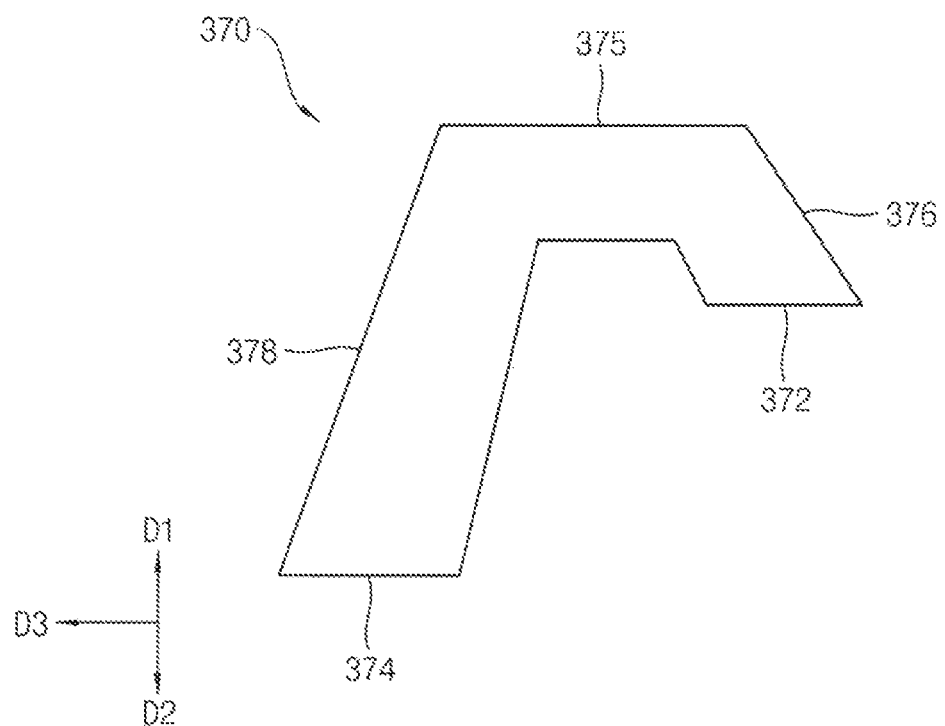
FIG. 12 is a cross-sectional view for describing a light guide structure of FIG. 11.
Figure 13:
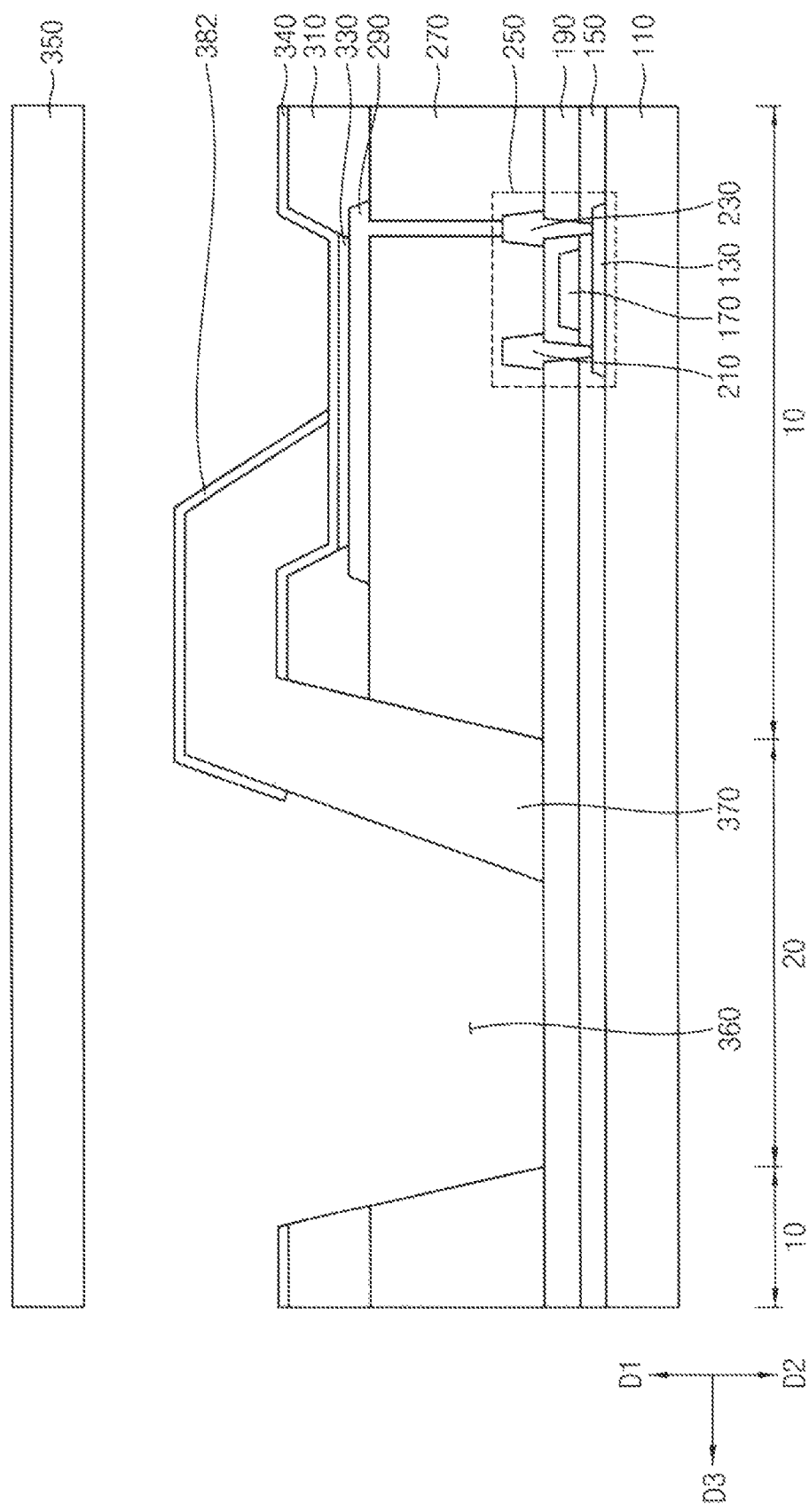
FIG. 13 is a cross-sectional view illustrating an OLED device in accordance with example embodiments.
Figure 14:
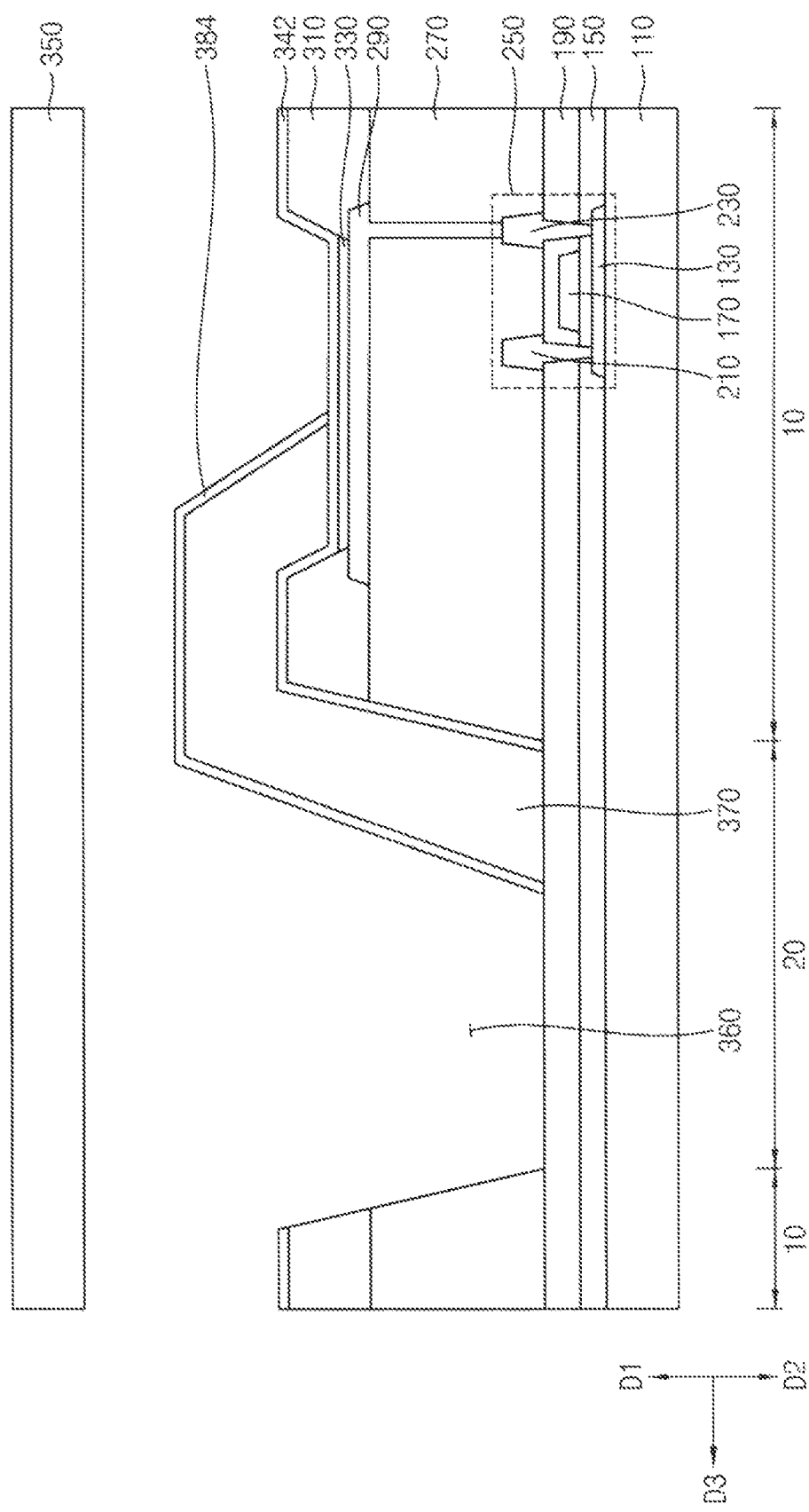
FIG. 14 is a cross-sectional view illustrating an OLED device in accordance with example embodiments.

FIG. 11 is a cross-sectional view illustrating an OLED device in accordance with example embodiments, and FIG. 12 is a cross-sectional view for describing a light guide structure of FIG. 11. FIG. 13 is a cross-sectional view illustrating an OLED device in accordance with example embodiments, and FIG. 14 is a cross-sectional view illustrating an OLED device in accordance with example embodiments. OLED devices illustrated in FIGS. 11, 12, 13, and 14 may have a configuration substantially the same as or similar to that of an OLED device 100 described with reference to FIGS. 2, 3, and 4 except a reflection pattern 380, a reflection pattern 382, a reflection pattern 384, and an upper electrode 342. In FIGS. 11, 12, 13, and 14, detailed descriptions for elements that are substantially the same as or similar to elements described with reference to FIGS. 2, 3, and 4 may not be repeated.

Referring to FIGS. 2, 3, 4, 11, and 12, an OLED device may include a substrate 110, a semiconductor element 250, a planarization layer 270, a sub-pixel structure, a pixel defining layer 310, a light guide structure 370, a reflection pattern 380, an encapsulation substrate 350, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. Further, the light emitting layer 330 may include an organic emission layer (EL), a hole injection layer (HIL), a hole transfer layer (HTL), an electron transfer layer (ETL), an electron injection layer (EIL), etc.

The reflection pattern 380 may be disposed in an upper surface of the light guide structure 370 that is located in a sub-pixel region 10 (e.g., an upper surface and a sidewall of the light guide structure 370 that is located in the sub-pixel region 10), and may expose an upper surface of the light guide structure 370 that is located in a transparent region 20 (e.g., a sidewall of the light guide structure 370 that is located in the transparent region 20). As illustrated in FIG. 12, the light guide structure 370 may have a first sidewall 376, an upper surface 375, and a second sidewall 378. The reflection pattern 380 may be disposed in the first sidewall 376 that is located in the sub-pixel region 10 and the upper surface 375 of the light guide structure 370 of lateral sidewalls (e.g., the first sidewall 376 and the second sidewall 378) of the light guide structure 370.

In addition, the light guide structure 370 may include an incidence surface 372 on which a second light 332 emitted from a second region 14 of the EL is incident and an emission surface 374 on which the second light 332 is emitted. Here, the incidence surface 372 of the light guide structure 370 may be defined as a contact surface where the upper electrode 340 that is located on the EL is in contact with the light guide structure 370, and the emission surface 374 of the light guide structure 370 may be defined as a contact surface where the insulating interlayer 190 that is located in the transparent region 20 is in contact with the light guide structure 370.

The second light 332 emitted from the second region 14 of the EL may be incident inside the light guide structure 370 through the incidence surface 372. In addition, the second light 332 may have a predetermined light path between the upper electrode 340 and the reflection pattern 380, such that the second light 332 may travel in the third direction D3. Here, the second light 332 may be reflected or be totally reflected inside the light guide structure 370 in a third direction D3, and the second light 332 may be transmitted inside the light guide structure 370. The second light 332 that is transmitted inside the light guide structure 370 in the third direction D3 may be emitted into the outside through the emission surface 374. The reflection pattern 380 may have a relatively thin thickness capable of reflecting the second light 332, and may include a metal, a metal alloy, metal nitride, conductive metal oxide, transparent conductive materials, etc. Theses may be used alone or in a suitable combination thereof. Alternatively, the reflection pattern 380 may have a multi-layered structure.

In some example embodiments, since an external light (e.g., a light transmitting the encapsulation substrate 350 from the outside) is reflected from the reflection pattern 380, a black matrix or a polarizing film, etc may be disposed on the reflection pattern 380.

As the reflection pattern 380 is disposed on the first sidewall 376 of the light guide structure 370 and the upper surface 375 of the light guide structure 370, a reflectance of the second light 332 incident into the incidence surface 372 may be increased inside the light guide structure 370. For example, a light escaping outside the light guide structure 370 (e.g., a light that is transmitted outside the light guide structure 370) among the second light 332 incident into the incidence surface 372 may be reduced. Accordingly, the second light 332 emitted in a second direction D2 may be relatively increased, and a visibility of a displaying image may be relatively increased in a bottom surface of the OLED device.

As illustrated in FIG. 13, the reflection pattern 382 may be disposed on the first sidewall 376 of the light guide structure 370, a portion of the second sidewall 378 of the light guide structure 370, and the upper surface 375 of the light guide structure 370.

As the reflection pattern 382 is disposed on the first sidewall 376 of the light guide structure 370, a portion of the second sidewall 378 of the light guide structure 370, and the upper surface 375 of the light guide structure 370, a reflectance the second light 332 incident into the incidence surface 372 may be further increased inside the light guide structure 370. For example, a light escaping outside the light guide structure 370 (e.g., a light that is transmitted outside the light guide structure 370) among the second light 332 incident into the incidence surface 372 may be further reduced.

As illustrated in FIG. 14, the upper electrode 342 may be interposed between the light guide structure 370 and the pixel defining layer 310 that is located adjacent to the EL and the transparent region 20, and may extend along a sidewall of the pixel defining layer 310 the is located adjacent to the transparent region 20. In other word, the upper electrode 342 may be entirely disposed under a lower surface of the light guide structure 370

The reflection pattern 384 may be disposed on the first sidewall 376 of the light guide structure 370, the second sidewall 378 of the light guide structure 370, and the upper surface 375 of the light guide structure 370. In other word, the reflection pattern 384 may be entirely disposed on an upper surface of the light guide structure 370.

The second light 332 may be reflected or be totally reflected between the reflection pattern 384 that is disposed on an upper surface of the light guide structure 370 and the upper electrode 342 that is disposed under a lower surface of the light guide structure 370 in the third direction D3 such that the second light 332 emitted from the second region 14 the EL is emitted outside of the light guide structure 370.

As the reflection pattern 384 and the upper electrode 342 are entirely disposed on upper surface of the light guide structure 370 and under a lower surface of the light guide structure 370, respectively, a reflectance of the second light 332 incident into the incidence surface 372 may be further increased inside the light guide structure 370. Accordingly, the second light 332 emitted in a second direction D2 may be relatively increased, and a visibility of a displaying image may be relatively increased in a bottom surface of the OLED device.

Figure 15:
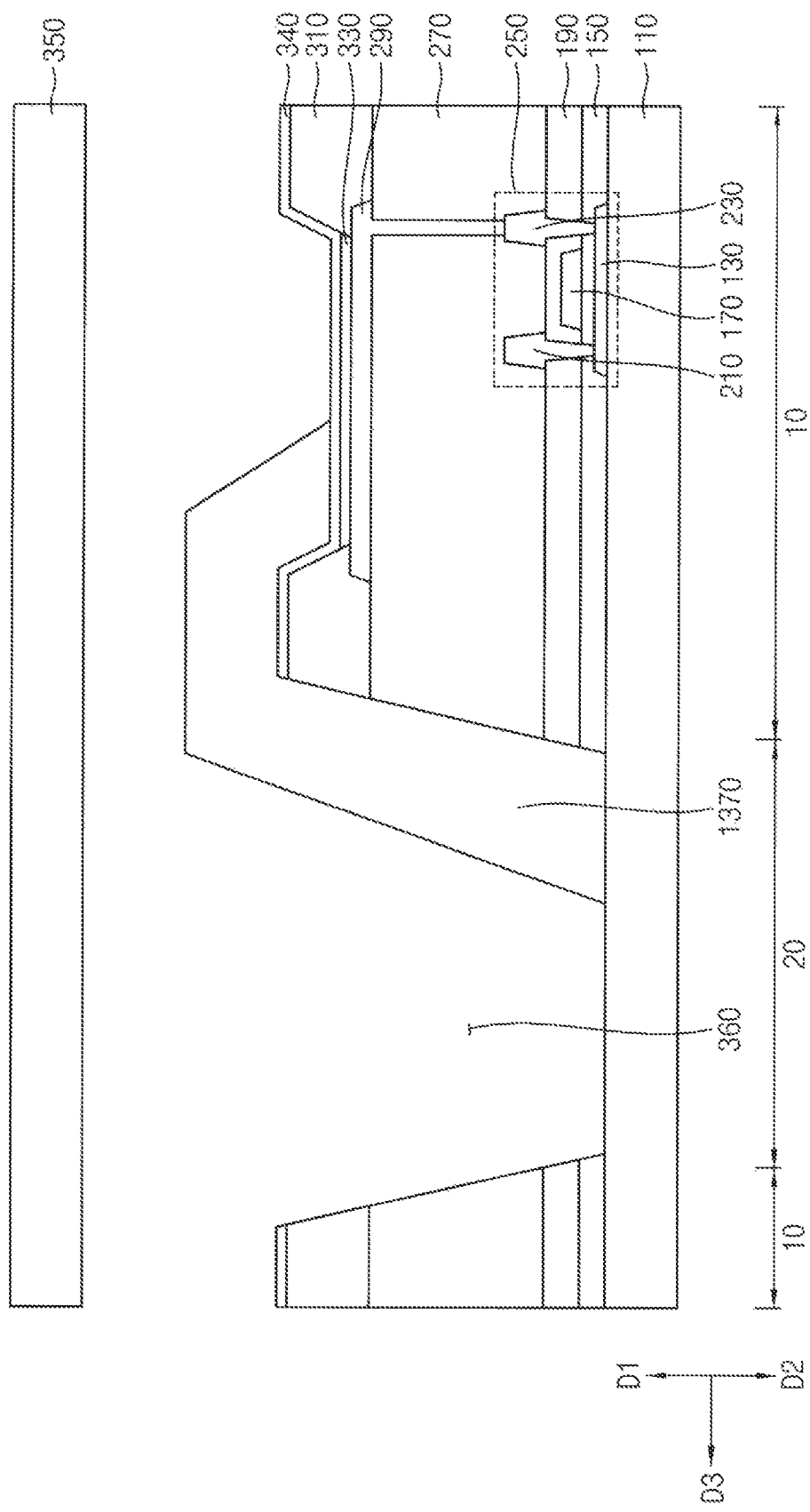
FIG. 15 is a cross-sectional view illustrating an OLED device in accordance with example embodiments.

FIG. 15 is a cross-sectional view illustrating an OLED device in accordance with example embodiments. An OLED device illustrated in FIG. 15 may have a configuration substantially the same as or similar to that of an OLED device 100 described with reference to FIGS. 2, 3, and 4 except a light guide structure 1370. In FIG. 15, detailed descriptions for elements that are substantially the same as or similar to elements described with reference to FIGS. 2, 3, and 4 may not be repeated.

Referring to FIGS. 2, 3, 4, and 15, an OLED device may include a substrate 110, a semiconductor element 250, a planarization layer 270, a sub-pixel structure, a pixel defining layer 310, a light guide structure 1370, an encapsulation substrate 350, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. Further, the light emitting layer 330 may include an organic emission layer (EL), a hole injection layer (HIL), a hole transfer layer (HTL), an electron transfer layer (ETL), an electron injection layer (EIL), etc.

The gate insulation layer 150 may be disposed on the active layer 130. The gate insulation layer 150 may cover the active layer 130 in the sub-pixel region 10 on the substrate 110, and may expose the transparent region 20 on the entire substrate 110. The gate insulation layer 150 may include a silicon compound, a metal oxide, etc.

The insulating interlayer 190 may be disposed on the gate electrode 170. The insulating interlayer 190 may cover the gate electrode 170 in the sub-pixel region 10, and may expose the transparent region 20 on the substrate 110. The insulating interlayer 190 may include a silicon compound, a metal oxide, etc.

The light guide structure 1370 may be disposed in a portion of the sub-pixel region 10 and a portion of the transparent region 20 on the substrate 110. In example embodiments, the light guide structure 1370 may overlap a portion of the EL and a portion of the substrate 110 that is located in the transparent region 20. That is, the light guide structure 1370 may be disposed on a portion of the EL, and may extend along a profile of the planarization layer 270, the pixel defining layer 310, and the upper electrode 340 in a third direction D3 that is vertical to first and second directions D1 and D2. In other word, the light guide structure 1370 may cover a side wall, which is located adjacent to the EL, of lateral sidewalls of the transparent window 360.

The light guide structure 1370 may include an incidence surface 372 on which a second light 332 emitted from a second region 14 of the EL is incident and an emission surface 374 on which the second light 332 is emitted. Here, the incidence surface 372 of the light guide structure 1370 may be defined as a contact surface where the upper electrode 340 that is located on the EL is in contact with the light guide structure 1370, and the emission surface 374 of the light guide structure 1370 may be defined as a contact surface where the substrate 110 that is located in the transparent region 20 is in contact with the light guide structure 1370.

The second light 332 emitted from the second region 14 of the EL may be incident inside the light guide structure 1370 through the incidence surface 372. In addition, the second light 332 may have a predetermined light path inside the light guide structure 1370, such that the second light 332 may travel in the third direction D3. Here, the second light 332 may be totally reflected inside the light guide structure 1370 in the third direction D3, and the second light 332 may be transmitted inside the light guide structure 1370. The second light 332 that is transmitted inside the light guide structure 1370 in the third direction D3 may be emitted into the outside through the emission surface 374.

The second light 332 emitted from the emission surface 374 may transmit the substrate 110, and may be emitted in the second direction D2.

In example embodiments, as the gate insulation layer 150 and the insulating interlayer 190 are not disposed in the transparent region 20, the second light 332 emitted from the emission surface 374 may not transmit the gate insulation layer 150 and the insulating interlayer 190. Accordingly, a visibility of a displaying image may be relatively increased in a bottom surface of the OLED device.

Figure 16:
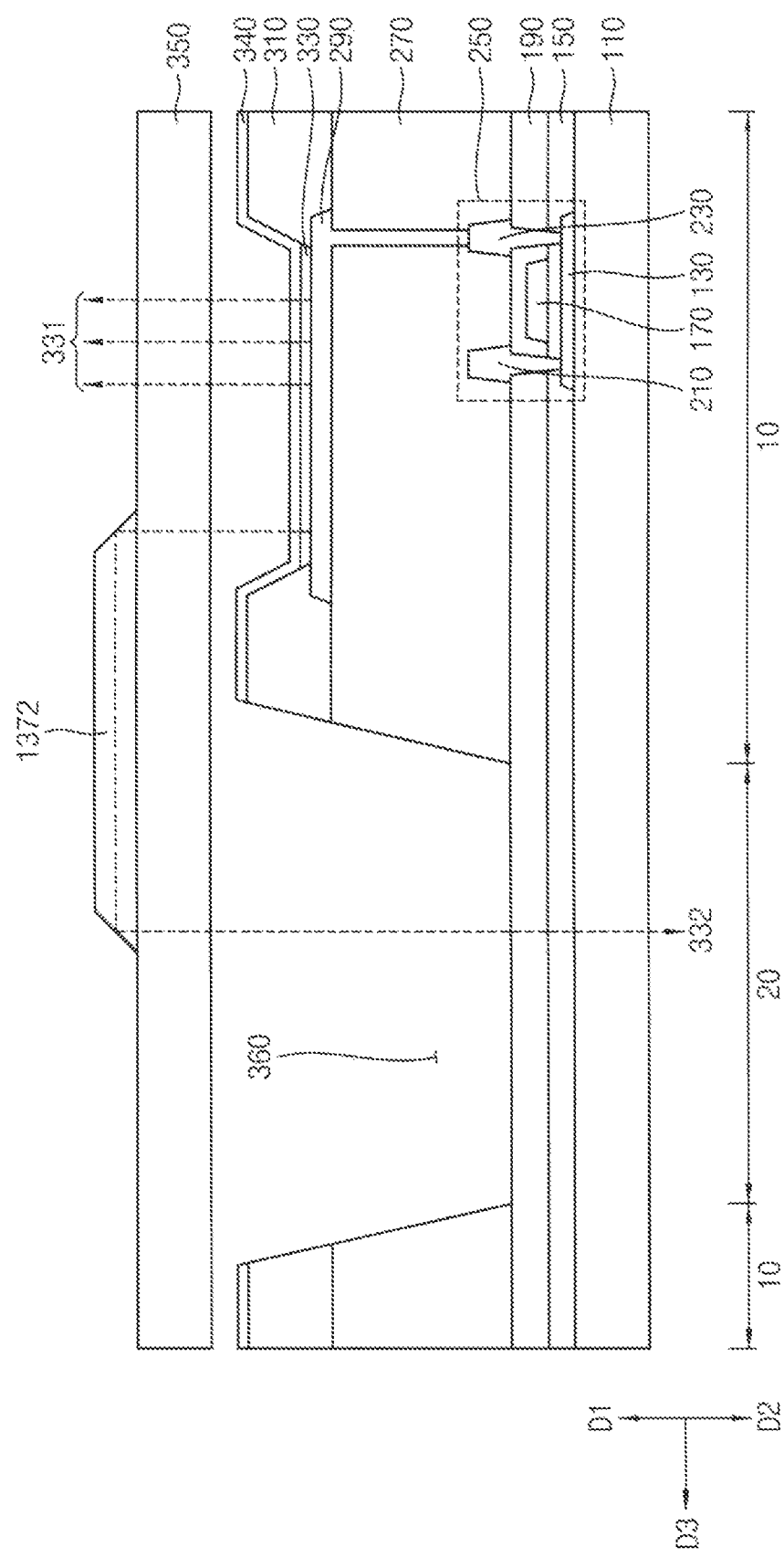
FIG. 16 is a cross-sectional view illustrating an OLED device in accordance with example embodiments.
Figure 17:
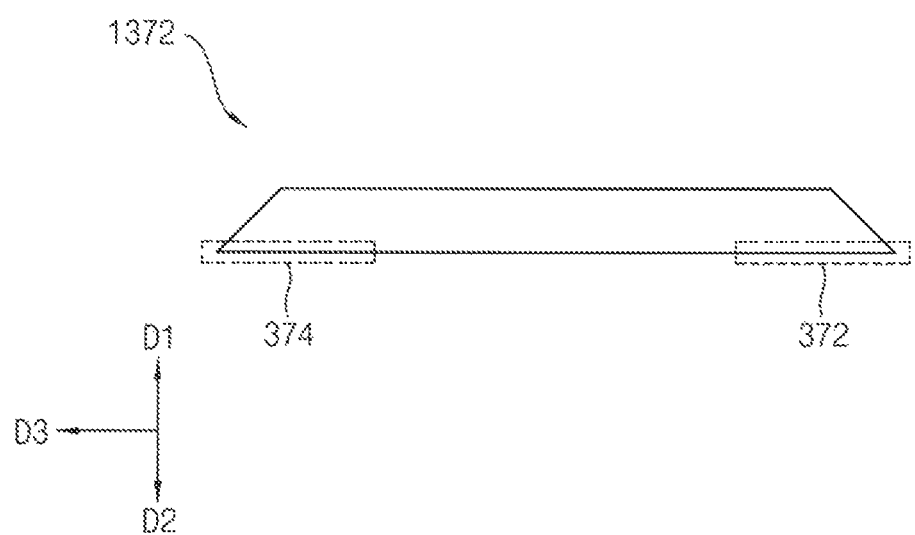
FIG. 17 is a cross-sectional view for describing a light guide structure of FIG. 16.
Figure 18:
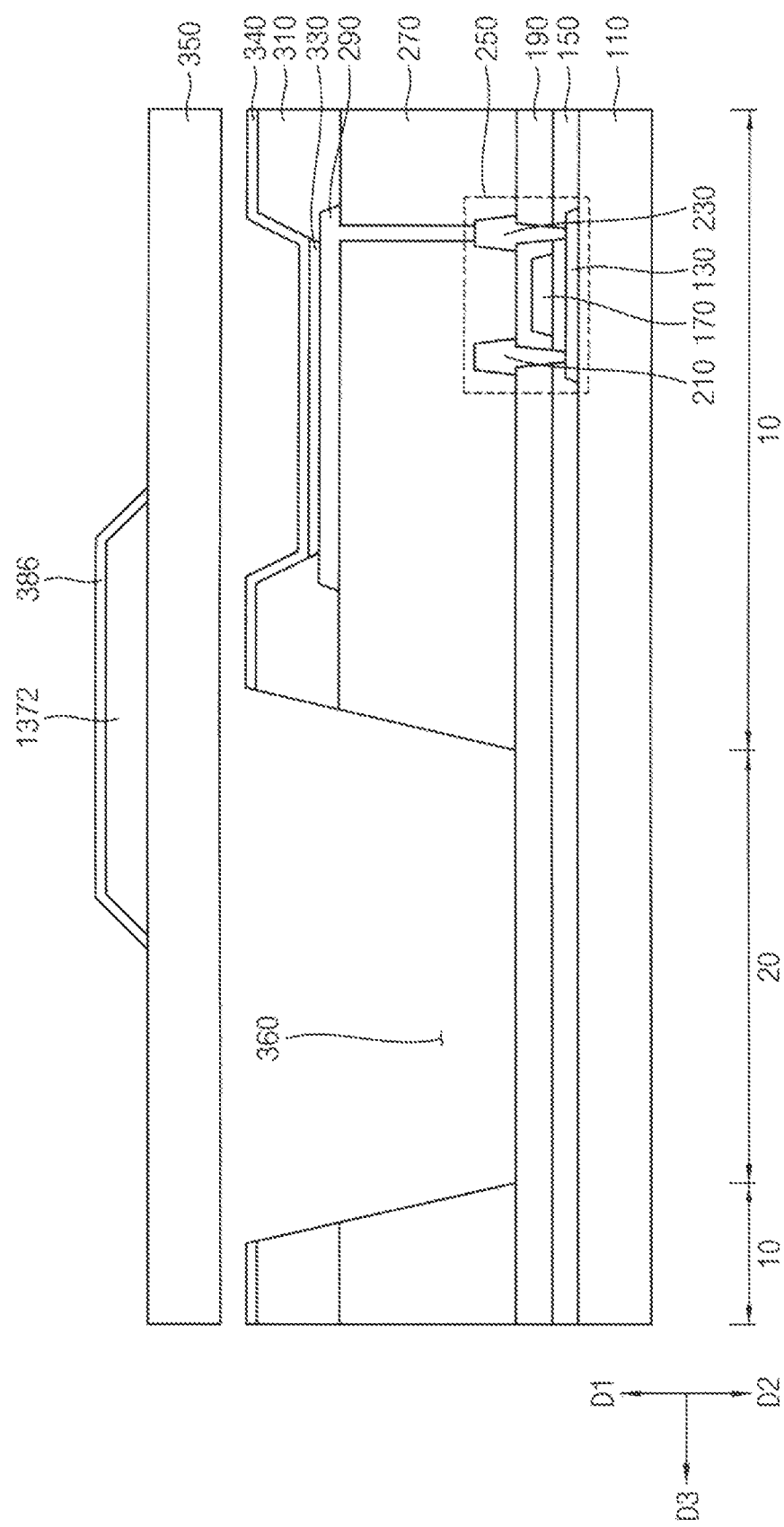
FIG. 18 is a cross-sectional view illustrating an OLED device in accordance with example embodiments.

FIG. 16 is a cross-sectional view illustrating an OLED device in accordance with example embodiments, and FIG. 17 is a cross-sectional view for describing a light guide structure of FIG. 16. FIG. 18 is a cross-sectional view illustrating an OLED device in accordance with example embodiments. OLED devices illustrated in FIGS. 16, 17 and 18 may have a configuration substantially the same as or similar to that of an OLED device 100 described with reference to FIGS. 2, 3, and 4 except a light guide structure 1372, and a reflection pattern 386. In FIGS. 16, 17, and 18, detailed descriptions for elements that are substantially the same as or similar to elements described with reference to FIGS. 2, 3, and 4 may not be repeated.

Referring to FIGS. 2, 3, 4, 16, and 17, an OLED device may include a substrate 110, a semiconductor element 250, a planarization layer 270, a sub-pixel structure, a pixel defining layer 310, a light guide structure 1372, an encapsulation substrate 350, etc. Here, the semiconductor element 250 may include an active layer 130, a gate insulation layer 150, a gate electrode 170, an insulating interlayer 190, a source electrode 210, and a drain electrode 230, and the sub-pixel structure may include a lower electrode 290, a light emitting layer 330, and an upper electrode 340. Further, the light emitting layer 330 may include an organic emission layer (EL), a hole injection layer (HIL), a hole transfer layer (HTL), an electron transfer layer (ETL), an electron injection layer (EIL), etc.

The encapsulation substrate 350 may be disposed between the upper electrode 340 and the light guide structure 1372. In other word, the light guide structure 1372 may be disposed in a portion of a sub-pixel region 10 and a portion of a transparent region 20 on the encapsulation substrate 350. The light guide structure 1372 may overlap a portion of the EL and a portion of the insulating interlayer 190 that is located in the transparent region 20. In example embodiments, a lower surface of the encapsulation substrate 350 may face the upper electrode 340, and the light guide structure 1372 may be disposed on an upper surface of the encapsulation substrate 350. The light guide structure 1372 may have a convex isosceles trapezoid structure in which a long side of it is facing the encapsulation substrate 350.

The EL may include a first region 12 and a second region 14. The first region 12 may be exposed by the light guide structure 1372, and the second region 14 may overlap the light guide structure 1372. Here, a light emitted in the first region 12 of the EL may be defined as a first light 331, and a light emitted in the second region 14 of the EL may be defined as a second light 332.

In the transparent region 20, the second light 332 emitted from the second region 14 of the EL may be emitted through the light guide structure 1372 in the second direction D2 that is opposite to the first direction D1. The second light 332 may display a displaying image in a bottom surface of the OLED device.

In particular, as illustrated in FIG. 17, the light guide structure 1372 may include an incidence surface 372 on which the second light 332 emitted from the second region 14 of the EL is incident and an emission surface 374 on which the second light 332 is emitted. Here, the incidence surface 372 of the light guide structure 1372 may be defined as a contact surface where the encapsulation substrate 350 that is located on the EL is in contact with the light guide structure 370, and the emission surface 374 of the light guide structure 1372 may be defined as a contact surface where the encapsulation substrate 350 that is located on the insulating interlayer 190 disposed in the transparent region 20 is in contact with the light guide structure 1372.

The second light 332 emitted from the second region 14 of the EL may be incident inside the light guide structure 1372 through the incidence surface 372. In addition, the second light 332 may have a predetermined light path inside the light guide structure 1372, such that the second light 332 may travel in the third direction D3. Here, the second light 332 may be reflected or be totally reflected inside the light guide structure 1372 in the third direction D3, and the second light 332 may be transmitted inside the light guide structure 1372. The second light 332 that is transmitted inside the light guide structure 1372 in the third direction D3 may be emitted into the outside through the emission surface 374.

Referring to FIG. 18, the OLED device illustrated in FIG. 18 may further include the reflection pattern 386.

The reflection pattern 386 may be entirely disposed on an upper surface of the light guide structure 1372. As the reflection pattern 386 is entirely disposed on an upper surface of the light guide structure 1372, a reflectance of the second light 332 incident into the incidence surface 372 may be increased inside of the light guide structure 1372. Accordingly, the second light 332 emitted into the second direction D2 may be relatively increased.

The present invention may be applied to various display devices including an organic light emitting display device. For example, the present invention may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device comprising:
    a transparent substrate including a plurality of pixel regions, each of the plurality of pixel regions including:
    a sub-pixel region;
    a transparent region which is disposed adjacent to the sub-pixel region and transmits light incident from outside;
    a lower electrode in the sub-pixel region on the transparent substrate;
    a light emitting layer on the lower electrode, the light emitting layer including an organic emission layer;
    an upper electrode on the light emitting layer; and
    a light guide structure partially covering an upper surface of the upper electrode, partially overlapping the organic emission layer and including an organic material that transmits light,
    wherein the light guide structure extends into the transparent region in a plan view so that a portion of light generated by the light emitting layer partially passes through the light guide structure and exits from a lower surface of the transparent region, and
    wherein the organic emission layer has a first portion covered by the light guide structure and a second portion not covered by the light guide structure in the plan view.

2. The OLED device of claim 1,
    wherein a first light emitted from the second portion of the organic emission layer is emitted in a first direction that is from the lower electrode into the upper electrode, and
    wherein a second light emitted from the first portion of the organic emission layer travels from the sub-pixel region to the transparent region through the light guide structure, and the second light in the transparent region is emitted in a second direction that is opposite to the first direction.

3. The OLED device of claim 2, wherein the light guide structure includes:
    an incidence surface on which the second light emitted from the first portion of the organic emission layer is incident; and
    an emission surface on which the second light is emitted,
    wherein the second light emitted from the first portion of the organic emission layer is incident inside the light guide structure through the incidence surface,
    wherein the second light has a predetermined light path inside the light guide structure, such that the second light travels in a direction from the sub-pixel region to the transparent region, and
    wherein the second light is emitted outside the light guide structure through the emission surface.

4. The OLED device of claim 2, further comprising:
    a reflection pattern disposed on the light guide structure.

5. The OLED device of claim 4, wherein the reflection pattern is disposed on an upper surface of the light guide structure that is located in the sub-pixel region, and exposes an upper surface of the light guide structure that is located in the transparent region.

6. The OLED device of claim 5, further comprising:
    a pixel defining layer disposed on the transparent substrate, the pixel defining layer covering both lateral portions of the lower electrode and exposing a portion of the lower electrode,
    wherein the upper electrode is interposed between the light guide structure and the organic emission layer and between the light guide structure and the pixel defining layer that is located adjacent to the transparent region, and exposes the transparent region.

7. The OLED device of claim 6, wherein the light guide structure includes:
    an incidence surface on which the second light emitted from the first portion of the organic emission layer is incident; and
    an emission surface on which the second light is emitted,
    wherein the second light emitted from the first portion of the organic emission layer is incident inside the light guide structure through the incidence surface,
    wherein the second light has a predetermined light path between the upper electrode and the reflection pattern, such that the second light travels in a direction from the sub-pixel region to the transparent region, and
    wherein the second light is emitted outside the light guide structure through the emission surface.

8. The OLED device of claim 4, wherein the reflection pattern is disposed on an upper surface of the light guide structure that is located in the sub-pixel region and an upper surface of the light guide structure that is located in the transparent region.

9. The OLED device of claim 8, further comprising:
a pixel defining layer disposed on the transparent substrate, the pixel defining layer covering both lateral portions of the lower electrode and exposing a portion of the lower electrode,
wherein the upper electrode is interposed between the light guide structure and the organic emission layer and between the light guide structure and the pixel defining layer that is located adjacent to the transparent region, and exposes the transparent region, and
wherein the upper electrode extends along a side wall of the pixel defining layer that is located adjacent to the transparent region.

10. The OLED device of claim 9, wherein the second light emitted from the first portion of the organic emission layer is reflected between the reflection pattern disposed on the upper surface of the light guide structure and the upper electrode disposed under a lower surface of the light guide structure in a direction from the sub-pixel region to the transparent region such that the second light is emitted outside the light guide structure.

11. The OLED device of claim 1, further comprising:
an encapsulation substrate disposed on the upper electrode; and
a filler filling a space between the light guide structure and the encapsulation substrate,
wherein a refractive index of the light guide structure is greater than a refractive index of the filler.

12. The OLED device of claim 1, further comprising:
an encapsulation substrate disposed between the upper electrode and the light guide structure,
wherein a lower surface of the encapsulation substrate faces the upper electrode, and the light guide structure is disposed on an upper surface of the encapsulation substrate.

13. The OLED device of claim 12, further comprising:
a reflection pattern disposed on the light guide structure.

14. The OLED device of claim 1, further comprising:
a semiconductor element disposed between the transparent substrate and the lower electrode,
wherein the semiconductor element includes:
an active layer disposed in the sub-pixel region on the transparent substrate;
a gate insulation layer disposed on the transparent substrate to cover the active layer in the sub-pixel region;
a gate electrode disposed on the active layer;
an insulating interlayer disposed on the gate insulation layer to cover the gate electrode in the sub-pixel region; and
source and drain electrodes disposed on the gate electrode.

15. The OLED device of claim 14, wherein the light guide structure in the sub-pixel region contacts the upper electrode, and the light guide structure in the transparent region contacts the insulating interlayer.

16. The OLED device of claim 14, wherein the gate insulation layer and the insulating interlayer expose the transparent region.

17. The OLED device of claim 16, wherein the light guide structure in the sub-pixel region contacts the upper electrode, and the light guide structure in the transparent region contacts the transparent substrate.

18. The OLED device of claim 17, further comprising:
a planarization layer disposed on the insulating interlayer, the planarization layer covering the source and drain electrodes in the sub-pixel region and exposing the transparent region; and
a pixel defining layer disposed in the sub-pixel region on the planarization layer, the pixel defining layer covering both lateral portions of the lower electrode and exposing a portion of the lower electrode.

19. The OLED device of claim 18, wherein the light guide structure covers the pixel defining layer that is located adjacent to the transparent region, and the planarization layer, and is disposed in a portion of the transparent region.

20. The OLED device of claim 19, wherein the upper electrode is interposed between the light guide structure and the organic emission layer and between the light guide structure and the pixel defining layer that is located adjacent to the transparent region, and exposes the transparent region.

* * * * *